(12) United States Patent
Rorato

(10) Patent No.: US 10,303,784 B2
(45) Date of Patent: May 28, 2019

(54) QUERYING A DATABASE WITH LIKENESS CRITERION

(71) Applicant: Dassault Systemes, Velizy Villacoublay (FR)

(72) Inventor: Remy Rorato, Paris (FR)

(73) Assignee: Dassault Systemes, Velizy Villacoublay (FR)

( * ) Notice: Subject to any disclaimer, the term of this patent is extended or adjusted under 35 U.S.C. 154(b) by 323 days.

(21) Appl. No.: 15/160,020

(22) Filed: May 20, 2016

(65) Prior Publication Data

US 2016/0350335 A1    Dec. 1, 2016

(30) Foreign Application Priority Data

May 28, 2015  (EP) .................................... 15305808

(51) Int. Cl.
| | | |
|---|---|---|
| *G06F 17/30* | (2006.01) | |
| *G06T 17/20* | (2006.01) | |
| *G06F 17/50* | (2006.01) | |

(52) U.S. Cl.
CPC .. *G06F 17/30259* (2013.01); *G06F 17/30277* (2013.01); *G06T 17/20* (2013.01); *G06F 17/50* (2013.01)

(58) Field of Classification Search
CPC ...................................................... G06F 17/30
(Continued)

(56) References Cited

U.S. PATENT DOCUMENTS 6,397,206 B1 * 5/2002 Hill .................. G06F 17/30463
707/713
6,615,503 B1  9/2003 Nzomigni et al.
(Continued)

FOREIGN PATENT DOCUMENTS

| CN | 1647112 | 7/2005 |
|---|---|---|
| CN | 101059335 | 10/2007 |

(Continued)

OTHER PUBLICATIONS

Boltcheve, D., "An Iterative Algorithm for Homology Computation on Simplical Shapes", Computer Aided Design, vol. 43, No. 11, pp. 1457-1467 Sep. 2, 2011.
(Continued)

*Primary Examiner* — Kim T Nguyen
(74) *Attorney, Agent, or Firm* — Hamilton, Brook, Smith & Reynolds, P.C.

(57) ABSTRACT

A computer-implemented method and system for querying a database that comprises 3D modeled objects that represent mechanical parts. The method or system provides a query that includes a likeness criterion relative to the value of a predetermined shape descriptor for an input 3D modeled object. A next step returns, as results of the query, respective 3D modeled objects of the database based on an extent to which the value of the predetermined shape descriptor for the respective 3D modeled object respects the likeness criterion. The value of the predetermined shape descriptor for a respective 3D modeled object includes a set of axis systems that are trihedral. The likeness increasingly depends on an extent to which sets of axis systems match each other modulo a same similarity transformation. Such a method and system improves the querying of a database that comprises 3D modeled objects that represent mechanical parts.

14 Claims, 8 Drawing Sheets providing a query that includes a likeness criterion relative to the value of a predetermined shape descriptor for an input 3D modeled object — S1 returning, as results of the query, respective 3D modeled objects of the database, a respective 3D modeled object being returned based on an extent to which the value of the predetermined shape descriptor for the respective 3D modeled object respects the likeness criterion — S2

(58) Field of Classification Search
USPC .......................................................... 707/758
See application file for complete search history.

(56) References Cited

U.S. PATENT DOCUMENTS

| | | | |
|---|---|---|---|
| 6,721,614 | B2 | 4/2004 | Duncan et al. |
| 6,768,928 | B1 | 7/2004 | Nagasawa et al. |
| 6,778,970 | B2 | 8/2004 | Au |
| 7,027,054 | B1 | 4/2006 | Cheiky |
| 7,269,808 | B2 | 9/2007 | Bruce et al. |
| 7,657,083 | B2 * | 2/2010 | Parr .................. G06K 9/00201 345/419 |
| 7,688,318 | B2 | 3/2010 | O'Malley, III et al. |
| 7,733,340 | B1 | 6/2010 | Desimone et al. |
| 7,913,190 | B2 | 3/2011 | Grimaud |
| 8,248,407 | B2 | 8/2012 | Deslandes |
| 8,416,240 | B1 * | 4/2013 | Kuffner, Jr. ....... G06F 17/30047 345/426 |
| 8,606,774 | B1 * | 12/2013 | Makadia .................. G06F 17/30 345/653 |
| 8,659,596 | B2 * | 2/2014 | Corazza .................. G06T 17/20 345/419 |
| 8,812,272 | B2 | 8/2014 | Martin et al. |
| 8,976,179 | B2 * | 3/2015 | Kuffner, Jr. ....... G06F 17/30047 345/426 |
| 8,982,122 | B2 * | 3/2015 | Corazza .................. G06T 17/20 345/423 |
| 9,304,332 | B2 * | 4/2016 | Fonte .................. G06Q 30/0621 |
| 9,449,430 | B2 | 9/2016 | Janvier |
| 9,798,835 | B2 | 10/2017 | Rorato |
| 9,830,703 | B2 * | 11/2017 | Meyer .................... G06T 7/507 |
| 9,881,388 | B2 | 1/2018 | Rorato et al. |
| 9,916,345 | B1 | 3/2018 | Makadia |
| 9,916,538 | B2 | 3/2018 | Zadeh et al. |
| 2002/0008700 | A1 | 1/2002 | Fuki |
| 2002/0095276 | A1 | 7/2002 | Rong et al. |
| 2003/0191627 | A1 | 10/2003 | Au |
| 2007/0279414 | A1 | 12/2007 | Vandenbrande et al. |
| 2008/0143714 | A1 | 6/2008 | Huang et al. |
| 2009/0182450 | A1 | 7/2009 | Goldschmidt |
| 2011/0224813 | A1 | 9/2011 | Takatsuka |
| 2012/0078587 | A1 | 3/2012 | Martin et al. |
| 2012/0173212 | A1 | 7/2012 | Rameau |
| 2014/0184594 | A1 | 7/2014 | Janvier |
| 2014/0188439 | A1 | 7/2014 | Rorato |
| 2014/0354636 | A1 | 12/2014 | Rorato et al. |
| 2016/0117792 | A1 | 4/2016 | Rolland-Neviere |
| 2016/0350335 | A1 | 12/2016 | Rorato |
| 2016/0350387 | A1 | 12/2016 | Marini et al. |
| 2017/0371948 | A1 | 12/2017 | Rorato |
| 2018/0137118 | A1 | 5/2018 | Lieutier |

FOREIGN PATENT DOCUMENTS

| | | |
|---|---|---|
| CN | 101995231 | 3/2011 |
| EP | 0 646 884 A2 | 4/1995 |
| EP | 0 646 884 A3 | 4/1995 |
| EP | 0 964 364 A2 | 12/1999 |
| EP | 2 169 567 A2 | 3/2010 |
| EP | 2 387 004 A1 | 11/2011 |
| JP | 2001250130 | 9/2001 |
| WO | WO 2004/068300 A2 | 8/2004 |
| WO | WO 2008/094170 A1 | 8/2008 |
| WO | WO 2011/103031 A1 | 8/2011 |
| WO | WO 2015/085435 A1 | 12/2014 |

OTHER PUBLICATIONS

Cardone, A., et al. "A Survey of Shape Similarity Assessment Algorithms for Product Design and Manufacturing Applications", Journal of Computing and Information Science in Engineering, vol. 3 No. 2, pp. 109-118, Jan. 1, 2003.

European Search Report for EP 16 17 6763 dated Dec. 1, 2016.
European Search Report for EP 16 30 6488 dated May 23, 2017.
Frosini, P., et al. "Combining Persistent Homology and Invariance Groups for Shape Comparison", Discrete & Computational Geometry, vol. 55, No. 2, pp. 373-409, Feb. 2, 2016.
Oudot, S., Topological Signatures:, Presentation given in Springs School in LA Marsa, pp. 1-86, Apr. 2016.
Tangelder, J., et al., "A Survey of Content Based 3D Shape Retrieval Methods", Multimedia Tools and Applications, Kluwer Academic Publishers, vol. 39, No. 3, pp. 441-471; Dec. 8, 2007.
Working with Pattern Recognition; http://learningexchange.ptc.com/tutorial/519/working-with-pattern-recognition (Date unavailable).
Wagner, et al. "Modeling Software with Finite State Machines" Auerbach Publications, 2006.
Chiang, L., et al. "Identification of Patterns of Repeated Parts in Solid Objects", IMATI Report Series, pp. i-111, Nov. 2, 2016.
Dang, Q.V., et al., "Similarity Detection for Free-Form Parametric Models", 21st International Conference on Computer Graphics, Visualization and Computer Vision, pp. 239-248 (2013).
European Search Report for EP 16 30 6790 dated Jun. 7, 2017, 3 pages.
Gordon, L., "Comparing 3D CAD Modelers—What Designers should know about history-based and dynamic schemes", Machine Design, pp. 1-4, Nov. 22, 2006.
3DPartFinder by 3DSemantix—Geometric search engine > Home; http://www.3dpartfinder.com, (2016).
Altmeyer, J. et al., "Reuse of Design Objects in CAD Frameworks," IEEE/ACM International Conference on Computer-Aided Design, Digest of Technical Papers, pp. 754-761 (Nov. 6, 1994).
Babic, B., et al., "A Review of Automated Feature Recognition with Rule-Based Pattern Recognition," *Computers in Industry*, 59:321-337 (2008).
Beardsly, Jason, "Seamless Servers: The Case for and Against," *Massively MultiPlayer Game Development*, Section 3.1, 211-227.
Bespalov, D. et al., "Local Feature Extraction and Matching Partial Objects", *Computer Aided Design*, 38(9): 1020-1037 (2006).
Biasotti, S. et al., "Sub-part correspondence by structural descriptors of 3D shapes," *Computer-Aided Design*, 38(9): 1002-1019 (Sep. 2006).
Brière-Côté, Antoine et al., "Comparing 3D CAD Models: Uses, Methods, Tools and Perspectives," *Computer-Aided Design & Applications*, 9(6): 771-794 (2012).
Clark, D.E.R. et al., "Benchmarking shape signatures against human perceptions of geometric similarity," *Computer-Aided Design*, 38(9): 1038-1051 (Sep. 2006).
Cornelio A. et al., "Integration and Cataloging of Engineering Design Information," *Systems Integration '90*, IEEE Comput., Soc., US, pp. 720-729 (Apr. 23, 1990).
Creo™ Parametric Data Sheet, © 2011 Parametric Technology Corporation, available at http://www.creo.uk.com/creo_parametric_mapping.htm, last accessed Mar. 27, 2014.
Daras, P., et al., "A 3D Shape Retrieval Framework Supporting Multimodal Queries", Int J Comput Vis 89: 229-247 (2010).
European Search Report completed May 13, 2013 for European Application No. EP 12306721.
European Search Report, European Application No. EP 10 30 6026, Date of Completion of Search: Feb. 3, 2011, 8 pages.
European Search Report, European Application No. EP 12 30 6720, dated Jul. 4, 2013.
European Search Report, European Application No. EP 13 30 5700, dated Aug. 14, 2013.
Falcidieno, B. and Giannini, F., "A System for Extracting and Representing Feature Information Driven by the Application Context", *Proceedings IEEE International Conference on Robotics and Automation*, pp. 1672-1678 (Jan. 1, 1990).
Fonseca, M.J. et al., "Towards content-based retrieval of technical drawings through high-dimensional indexing," *Computers and Graphics*, 27(1): 61-69 (Feb. 2003).
Funkhouser, T. et al., "Modeling by Example," *ACM Transactions on Graphics*, 23(3): 652-663 (Aug. 1, 2004).
Funkhouser, Thomas et al., "A Search Engine for 3D Models," *ACM Transactions on Graphics*, vol. V, No. N, 10 202002, 28 Pages.
Imoru, C.O. et al., "On a Version of the Banach's Fixed Point Theorem," *General Mathematics*, vol. 16, Nr. 1, pp. 25-32 (2008).

(56) References Cited

OTHER PUBLICATIONS

Ismail, N., et al., "Feature Recognition Patterns for Form Features Using Boundary Representation Models," *Int J Adv Manuf Technol*, 20:553-556 (2002).

Kao, C.-Y., et al., "Extraction of 3D Object Features from CAD Boundary Representation Using the Super Relation Graph Method," *IEEE Transactions on Pattern Analysis and Machine Intelligence*, 17(12):1228-1233 (1995).

Kazhdan, M. et al. "Harmonic 3D Shape Matching," ACM SIGGRAPH Symposium on Computer Animation, p. 191 (Jul. 21, 2002).

Kazhdan, Michael et al., "Rotation Invariant Spherical Harmonic Representation of 3D Shape Descriptors," *Eurographics Symposium on Geometry Processing*, 9 pages. (2003).

Lee, K.S. et al., "Framework of an evolutionary design system incorporating design information and history," *Computers in Industry*, 44(3): pp. 205-227 (Apr. 2001).

Author: Lujie Ma, et al. Title: Automatic discovery of common design structures in CAD models; Publisher: Computer & Graphics 34 (2010) 545-555.

Maranzana, Roland, "3D Data Mining Part and Information Re-Use in a PLM Context," Proceedings of GT2007, May 14-17, 2013, Montreal, Canada, ASME Paper: GT2007-27966, American Society of Mechanical Engineers, New York, NY, 2007. http://dx.doi.org/10.1115/GT2007-27966, 37 pages (2013).

Munkres, James, R., "Elements of algebraic topology", Addison-Wesley Publishing Company, Inc. (1984).

Papadakis, P. et al, "Efficient 3D shape matching and retrieval using a concrete radialized spherical projection representation," *ScienceDirect*, 40: 2437-2452 (2007).

Pauly, M., et al., "Discovering Structural Regularity in 3D Geometry," *ACM Transactions on Graphics*, 27(3):43:1-43:11 (2008).

Petre, R.D., "An experimental evaluation of view-based 2D/3D indexing methods", 2010 IEEE 26th Convention of Electrical and Electronics Engineers in Israel, Nov. 2010, Israel. pp. 924-928.

Santa-Cruz, D. and Ebrahimi, T., "Compression of Parametric Surfaces for Efficient 3D Model Coding," *VCIP*, 4671:280-291 (2002).

Shih, R., *Parametric Modeling with Creo™ Parametric: An Introduction to Creo™ Parametric 1.0*, SDC Publications © 2011 (table of contents only).

Shikhare, D., et al. "Compression of Large 3D Engineering Models Using Automatic Discovery of Repeating Geometric Features," *National Centre for Software Technology*, 233-240 (2001).

Wang, D., et al., "EQSM: An Efficient High Quality Surface Grid Generation Method Based on Remeshing," *Comput. Methods Appl. Mech. Engrg.*, 195:5621-5633 (2006).

Werghi, N., "Extracting Ordered Patterns from a Triangular Mesh Surface," *IEEE Potentials*, 34-43 (2011).

Yang, M., et al., "A Survey of Shape Feature Extraction Techniques". Peng-Yeng Yin. Pattern Recognition, IN-TECH, pp. 43-90 (2008).

\* cited by examiner

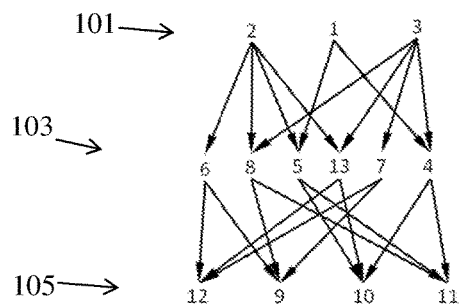
FIG. 6
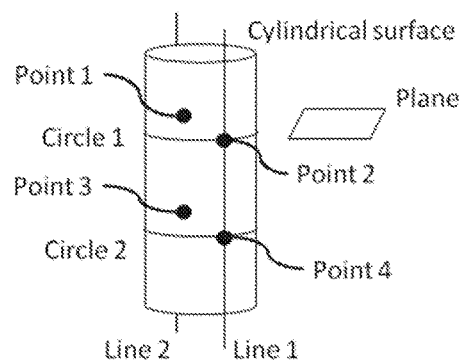
FIG. 8
1 → Plane
2 → Cylindrical surface
3 →
4 →
5 → Circle 1
6 →
7 → Circle 2
8 → Line 1
9 → Point 4
10 → Point 1
11 → Point 2
12 → Point 3
13 → Line 2
FIG. 7
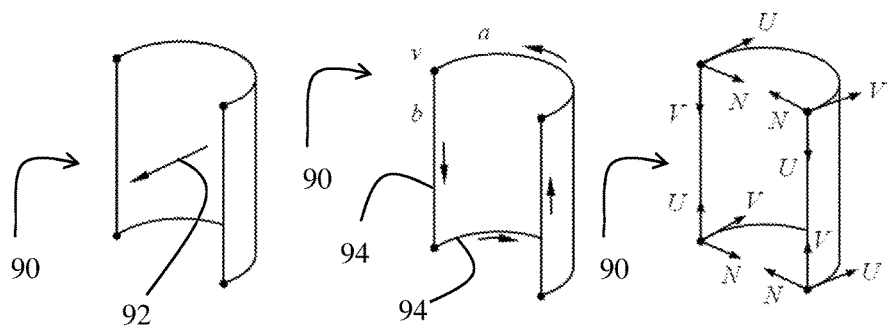
FIG. 9  FIG. 10  FIG. 11

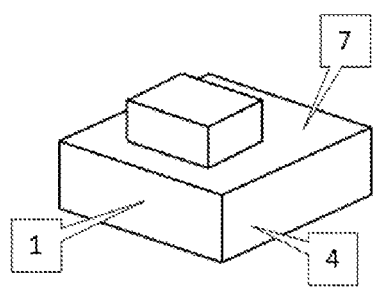
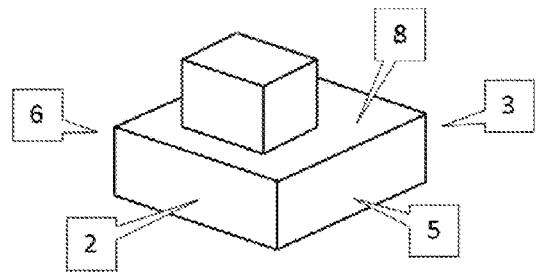
FIG. 27　　　　　　　FIG. 28
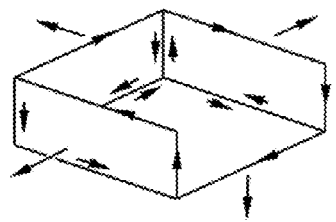
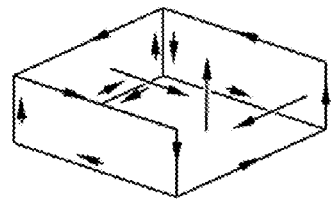
FIG. 29　　　　　　　FIG. 30
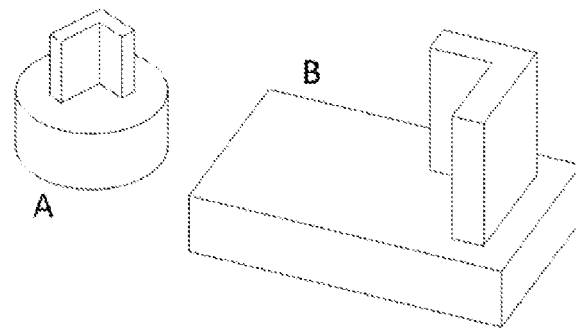
FIG. 31

QUERYING A DATABASE WITH LIKENESS CRITERION

RELATED APPLICATION(S)

This application claims priority under 35 U.S.C. § 119 or 365 to Europe, Application No. 15305808.6, filed May 28, 2015. The entire teachings of the above application(s) are incorporated herein by reference.

FIELD OF THE INVENTION

The invention relates to the field of computer programs and systems, and more specifically to a method, system and program for querying a database that comprises 3D modeled objects that represent mechanical parts.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context, there is a need to search an existing solid that is geometrically similar to another solid, e.g. to a solid being designed with a CAD system. This search is performed by comparing dedicated information, generally called "shape descriptor", attached to each solid. Searching similar objects in the context of a client/server architecture in specific may thus be performed as follows. By using a client computer, the designer creates or edits a 3D model A, typically a solid. The question is to find an existing solid that is similar to the one being designed. The database of candidate solids is hosted by a server computer. The client computer computes the shape descriptor s(A) of solid A. This shape descriptor is sent to the server computer together with a user-defined likeness/similarity criterion c. Then, a search algorithm is run on the server computer in order to find, if any, similar solids (i.e. solids "alike" the one being searched according to the likeness criterion). This searching makes use of shape descriptor s(A) together with a request relative to a likeness criterion c and pre-computed shape descriptors of solids in the database. Finally, similar solids are sent back to the client computer. Two solids are generally said to be "similar" or "alike" when they have the "same shape" or "almost the same shape" according to the common sense. Similarity may include mirroring, meaning that the mirror image of the solid is similar to the original solid. It may also include a scale factor, meaning that the scaled solid is similar to the original solid. The key feature of similar solid searching is thus the shape descriptor. The shape descriptor is some multidimensional and numerical information that is computed from the solid model and that is intensively used for comparison purpose.

On the one hand, there exists a shape descriptor technology based on radial and harmonic functions. The aim of a radial function is to encode a 3D shape, which is not generally rotation invariant, into numerical information that is rotation invariant. This eliminates the problem of relative positioning between the test solid and the candidate solid. The harmonic functions are a basis of functions and the shape descriptor is, in a sense, the coordinates of the radial function in the basis of harmonic functions. This technology is however designed for multi-purpose shape comparison and existing products lack efficiency in the context of mechanical parts, in that outputted results are not always relevant. Typical references are:

1. Document EP 2169567 A2;
2. *Rotation Invariant Spherical Harmonic Representation of 3D Shape Descriptors*. M. Kazhdan, T. Funkhouser, and S. Rusinkiewicz, Eurographics Symposium on Geometry Processing (2003); and
3. *A search engine for 3D models*. T. Funkhouser, P. Min, M. Kazhdan, J. Chen, A. Halderman, D. Dobkin, D. Jacobs, D.: ACM Transactions on Graphics 22(1), 83-105 (2003).

On the other hand, it is known that for solid models representing mechanical parts, another technology is available. The shape descriptor is computed from the B-Rep representation, more precisely from faces of the solid model. For example, one prior art (cited below) extracts geometric signatures for faces and matches them to distinguish equivalent faces from different faces between two B-Rep models. Yet, existing products still lack efficiency, not only from the relevancy point of view but also from the size of introduced data and speed points of view. This technology includes:

1. *Comparing 3D CAD Models: Uses, Methods, Tools and Perspectives*, Antoine Brière-Côté, Louis Rivest and Roland Maranzana, Computer-Aided Design & Applications, 9(6), 2012, 771-794; and
2. Msaaf, O.; Maranzana, R.; Rivest, L.: *Part data mining for information re-use in a PLM context*, Proceedings of GT2007, May 14-17, Montreal, Canada, ASME Paper: GT2007-27966, American Society of Mechanical Engineers, New York, N.Y., 2007.

Within this context, there is still a need for an improved solution for querying a database that comprises 3D modeled objects that represent mechanical parts.

SUMMARY OF THE INVENTION

It is therefore provided a computer-implemented method for querying a database that comprises 3D modeled objects that represent mechanical parts. The method comprises the step of providing a query that includes a likeness criterion relative to the value of a predetermined shape descriptor for an input 3D modeled object. The method also comprises the step of returning, as results of the query, respective 3D modeled objects of the database. A respective 3D modeled object is returned based on an extent to which the value of the predetermined shape descriptor for the respective 3D modeled object respects the likeness criterion. The 3D modeled objects of the database and the input 3D modeled object are each defined at least by a 3D mesh, the 3D mesh of a 3D modeled object having vertices and edges connecting the vertices, the vertices and the edges forming faces that represent the envelop of the mechanical part represented by the 3D modeled object. The value of the predetermined shape descriptor for a respective 3D modeled object includes a set of axis systems that are trihedral. The set of axis systems is in a bijective association with the set of pairs consisting of a respective vertex of the 3D mesh of the respective 3D modeled object and a respective face of the 3D mesh of the respective 3D modeled object. The axis of a respective axis system is oriented based on the directions, at the respective vertex, of the edges connected to the respective vertex, on a direction, at the respective vertex, normal to the envelop of the mechanical part represented by the 3D modeled object, and on an orientation of the face that corresponds to the outside of the mechanical part. The likeness of a first value of the predetermined shape descriptor relative to a second value of the predetermined shape descriptor increasingly depends on an extent to which the set of axis systems of the second value of the predetermined shape descriptor matches the set of axis systems of the first value of the predetermined shape descriptor modulo a same similarity transformation.

The method may comprise one or more of the following:
the extent to which the set of axis systems of the second value of the predetermined shape descriptor matches the set of axis systems of the first value of the predetermined shape descriptor is evaluated in a predetermined way for a given similarity transformation type;
the fact that a respective axis system of the second value of the predetermined shape descriptor matches a respective axis system of the first value of the predetermined shape descriptor modulo the given similarity transformation weights in the extent to which the set of axis systems of the second value of the predetermined shape descriptor matches the set of axis systems of the first value of the predetermined shape descriptor, only if the face that is associated to the respective axis system of the second value of the predetermined shape descriptor matches the face that is associated to the respective axis system of the first value of the predetermined shape descriptor modulo the given similarity transformation;
the extent to which the set of axis systems of the second value of the predetermined shape descriptor matches the set of axis systems of the first value of the predetermined shape descriptor is evaluated for a given similarity transformation as a ratio of the faces associated to axis systems of the second value of the predetermined shape descriptor that match faces associated to axis systems of the first value of the predetermined shape descriptor modulo the given similarity transformation;
the 3D modeled objects of the database and the input 3D modeled object are each further defined by supporting surfaces and data that define the faces formed by the vertices and the edges of the 3D meshes as a bounded portion of a respected supporting surface, the 3D modeled objects being thereby defined by a boundary representation; the value of the predetermined shape descriptor for a respective 3D modeled object further includes for each respective face of the respective 3D modeled object a sampling of the bounded portion of the supporting surface defined by the respective face; the likeness of a first value of the predetermined shape descriptor relative to a second value of the predetermined shape descriptor further increasingly depends on an extent to which the samplings of the second value of the predetermined shape descriptor match the samplings of the first value of the predetermined shape descriptor modulo the same similarity transformation;
the likeness of a first value of the predetermined shape descriptor relative to a second value of the predetermined shape descriptor is evaluated according to an iteration of a scheme that includes, at each iteration, finding a new candidate similarity transformation and then evaluating the likeness along the candidate similarity transformation, a new candidate similarity transformation being found at each iteration based solely on axis system information; and/or
the 3D modeled objects of the database and/or the input 3D modeled object are user-defined according to a mechanical design process.

It is further provided a database configured to be queried according to the above method. The database comprises 3D modeled objects that represent mechanical parts and that are each defined at least by a 3D mesh, the 3D mesh of a 3D modeled object having vertices and edges connecting the vertices, the vertices and the edges forming faces that represent the envelop of the mechanical part represented by the 3D modeled object. Each respective 3D modeled object of the database is associated to the value of a predetermined shape descriptor for the respective 3D modeled object. The value of the predetermined shape descriptor for a respective 3D modeled object includes a set of axis systems that are trihedral. The set of axis systems is in a bijective association with the set of pairs consisting of a respective vertex of the 3D mesh of the respective 3D modeled object and a respective face of the 3D mesh of the respective 3D modeled object. The axis of a respective axis system is oriented based on the directions, at the respective vertex, of the edges connected to the respective vertex, on a direction, at the respective vertex, normal to the envelop of the mechanical part represented by the 3D modeled object, and on an orientation of the face that corresponds to the outside of the mechanical part.

In an example, the 3D modeled objects of the database are each further defined by supporting surfaces and data that define the faces formed by the vertices and the edges of the 3D meshes as a bounded portion of a respected supporting surface, the 3D modeled objects being thereby defined by a boundary representation, and the value of the predetermined shape descriptor for a respective 3D modeled object further includes for each respective face of the respective 3D modeled object a sampling of the bounded portion of the supporting surface defined by the respective face.

In an example, the 3D modeled objects of the database are user-defined according to a mechanical design process.

It is further provided a computer readable storage medium having recorded thereon the database.

It is further provided a computer-implemented method for constructing such a database.

It is further provided a computer program, comprising instructions for performing any or both the two above methods.

It is further provided a computer readable storage medium having recorded thereon the computer program.

It is further provided a system comprising a processor coupled to a memory having recorded thereon the computer program and/or the database.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where:

FIGS. 4-31 illustrate examples of the method.

DETAILED DESCRIPTION OF THE INVENTION

A description of example embodiments of the invention follows.

The teachings of all patents, published applications and references cited herein are incorporated by reference in their entirety.

Figure 1:
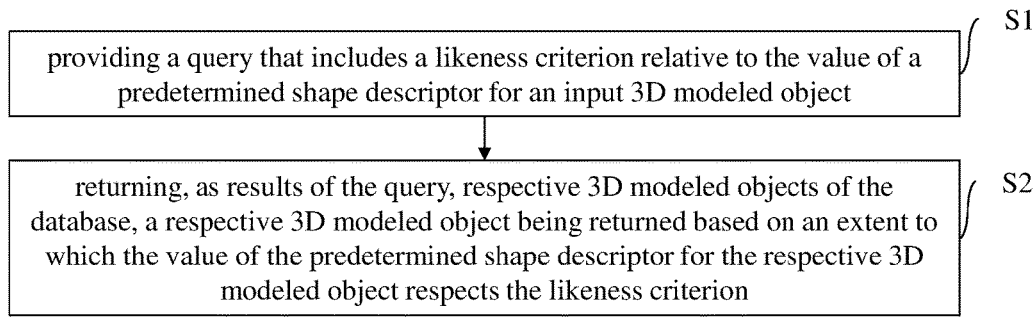
FIG. 1 shows a flowchart of an example of the method.

With reference to the flowchart of FIG. 1, it is proposed a computer-implemented method for querying a database that comprises (e.g. data of) 3D modeled objects that represent mechanical parts (i.e. each 3D modeled object of the database represents a respective mechanical part—at least its outer shape—, e.g. the term "mechanical part" also referring to an assembly thereof and/or to a portion thereof). The method comprises the step of providing S1 (e.g. to a database or to a plug-in/script running on such a database, e.g. at a client computer system or to a server computer system—i.e. database host—, e.g. the client possibly being confounded with the server, which may be the case if they are hosted by the same machine for example) a query that includes a likeness criterion (as part of the data that define the query, and e.g. at least as one of the possibly several criteria making the query, e.g. the query possibly including other criteria and optionally weights assigned to the different criteria, as very classical in the field of database search). The likeness criterion is relative to the value of a predetermined shape descriptor for an input 3D modeled object (e.g. the input 3D modeled object being thus an object searched in this way, e.g. in that objects similar/alike to the input are searched in the database). The method also comprises the step of returning S2 (e.g. to the client or at the server), as results of the query (i.e. the returned data including one or more such results or even no/null result—which means that not necessarily several results are returned, the plural form being used as it is the generic expression—, depending on the query and/or on the content of the searched data), respective 3D modeled objects of the database. A respective 3D modeled object is returned based on an extent to which the value of the predetermined shape descriptor for the respective 3D modeled object respects the likeness criterion.

Now, the 3D modeled objects of the database and the input 3D modeled object are each defined at least by a 3D mesh. The 3D mesh of a 3D modeled object has (by definition of the term "mesh") vertices and edges connecting the vertices. The vertices and the edges form faces that represent the envelop (i.e. geometry of the outer surface) of the mechanical part represented by the 3D modeled object. Also, the value of the predetermined shape descriptor for a respective 3D modeled object includes (among its data) a set of axis systems (i.e. data that define such set) that are trihedral (i.e. three vectors starting from a same origin), the set of axis systems being in a bijective (i.e. one-to-one) association with the set of pairs consisting of a respective vertex of the 3D mesh of the respective 3D modeled object (the origin of the respective axis system thereby being located at such respective vertex) and a respective face of the 3D mesh of the respective 3D modeled object (each axis system being associated to such a respective {vertex, face} pair, thereby leading to association of more than one axis system to a respective vertex if said vertex belongs to more than one face). The axis of a respective axis system is oriented based on (i.e. a predetermined scheme based on the following data is applied for the orientation): (i) the directions (and optionally also the orientations if any), at the respective vertex, of the edges connected to the respective vertex, (ii) a direction (e.g. predetermined in the data or computed on the fly), at the respective vertex, (e.g. representative of a) normal to the envelop of the mechanical part represented by the 3D modeled object, and (iii) an orientation of the face that corresponds to the outside of the mechanical part (e.g. according to a referential trihedral canonic orientation). The likeness of a first value of the predetermined shape descriptor relative to a second value of the predetermined shape descriptor increasingly depends on an extent to which the set of axis systems of the second value of the predetermined shape descriptor matches the set of axis systems of the first value of the predetermined shape descriptor, and this modulo a same similarity transformation.

Such a method improves the querying of a database that comprises 3D modeled objects that represent mechanical parts.

Notably, the method provides a solution to perform a search based on the 3D shape in a database thanks to its steps S1 and S2 and to the 3D definition of the value of the predetermined shape descriptor for a respective 3D modeled object. Thanks to the set of axis systems being in a bijective association with, not merely the vertices of the 3D mesh, but with the set of pairs consisting of a respective vertex of the 3D mesh of the respective 3D modeled object and a respective face of the 3D mesh of the respective 3D modeled object, the shape descriptor fully describes the 3D modeled object and increases relevance of the results returned to a query (from a 3D geometry likeness point of view).

Here, the "relevance" is such that the likeness of a result 3D shape returned with respect to an input 3D shape may, for example, correspond to the minimum of the integral of the distance (minimal distance measured from the surface of the input 3D shape to the surface of the result 3D shape) over all possible similarity transformations of the input 3D shape. Another example is to consider A and B two compact subsets of $\mathbb{R}^3$, respectively representing 3D modeled objects (e.g. B-reps of mechanical parts). The likeness between A and B can be quantified by using the well-known Hausdorff distance. Firstly, define $p(A,B) = \max_{a \in A} \min_{b \in B} d(a,b)$ where $d(a,b)$ is the Euclidean distance between points a and b. Then, the Hausdorff distance between A and B is $H(A,B) = \max\{p(A,B), p(B,A)\}$. Subsets A and B are perfectly similar if there exists a similarity transformation D such that $H(A,D(B))=0$. This is a way to quantify the natural perception of 3D similarity between two shapes.

Also, the definition is adapted to the 3D modeled objects of the database and the input 3D modeled object being defined by 3D meshes, which is often the case in 3D CAD design of mechanical parts, and to take advantage of such definition. Moreover, the specific definition retained for the shape descriptor is well-adapted to mechanical design in that it is well-adapted to a context where the designer focuses on the envelop of the mechanical part which is designed is an incremental way that forms and modifies the 3D mesh representing such envelop. In this context, the shape descriptor achieves a great ratio between size (in terms of memory space to store the shape descriptor but also in terms of the quantity of data to process when evaluating the likeness—which relates to the simplicity of the likeness evaluation and thus the speed of the method and/or the speed of the database construction) and the relevance of the results outputted by the method. The method indeed puts emphasis on the specific details incrementally added by the design in the mechanical part design process when in presence of a 3D mesh (that is, faces, directions of edges, directions normal to the envelop at vertices, and orientation of the face) in order to describe the shape in a compact way (relative to contemplating the whole B-Rep for example). In other words: the shape descriptor of the method is very fast to calculate because it is a matter of computing and storing 3D axis systems at vertices; it does not need a large amount of memory because same vectors of adjacent axis systems can be shared through a dictionary; the comparison program is fast and simple, which makes it efficient in a context of massive computing where data access is critical. Tests have shown that the method can run in about 20 ms in typical situations.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. For example, S1 may involve user-interaction as the query might be provided through the user designing the input 3D modeled object and/or calling for and parameterizing a search/query software functionality. The level of user-computer interaction required may depend on the level of automatism foreseen and put in balance with the need to implement user's wishes. In examples, this level may be user-defined and/or pre-defined.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database, e.g. on which the query is executed. The memory is any hardware adapted for such storage, possibly comprising several physical distinct parts (e.g. one for the program, and possibly one for the database). The system may thus be a client-server system, or a mere client system (the database being stored on a remote server, the method of FIG. 1 being thereby seen from the point of view of the client in such a case) or a mere server system (the query stemming from a remote client system, the method of FIG. 1 being thereby seen from the point of view of the server in such a case). It is noted that the method of FIG. 1 may be indifferently seen as implemented from the client point of view and/or from the server point of view, as both communicate to perform the method. The returning S2 can indeed be active (database), or passive (client requesting the query).

By "database", it is meant any collection of data (i.e. information) organized for search and retrieval (e.g. a relational database, e.g. based on a predetermined structured language, e.g. SQL). When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the method, the database comprises 3D modeled objects that represent mechanical parts and that are each defined at least by a 3D mesh as defined earlier. Each respective 3D modeled object of the database is furthermore associated (e.g. in a row or any other type of relation, depending on the database technology at use) to the value of a predetermined shape descriptor for the respective 3D modeled object, the value of the predetermined shape descriptor being as defined earlier (and it may be defined as a value of a field of the database or covering several fields, this being an implementation detail pertaining to database optimization and not further discussed here). Such a database can be built and/or incremented with new 3D modeled object(s) in order for example to be used in the querying method of FIG. 1 (if the database is appropriately configured). The database can thus be constructed in any way and it can be stored on the memory of the system as mentioned above, or on any other medium adapted for that. Such a database allows retrieving 3D modeled objects according to the method of FIG. 1, and it is thus a tool that may for example accelerate CAD design (by helping the designer retrieve relevant results and re-use them instead of re-designing everything from scratch, e.g. if the system is provided with such a re-use functionality).

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

Any 3D modeled object contemplated by the method may represent the geometry of a product to be manufactured in the real world subsequent to the completion of its virtual design with for instance a CAD software solution or CAD system, such as a (e.g. mechanical) part or assembly of parts. A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled objects contemplated by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), and/or a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 2:
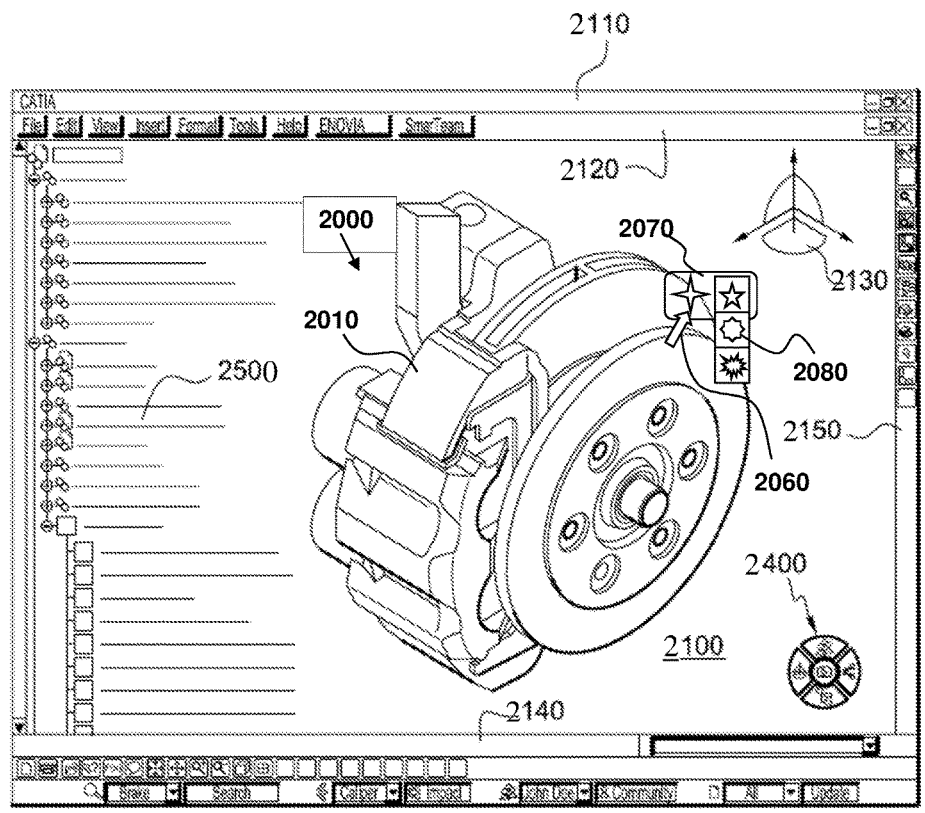
FIG. 2 shows an example of a graphical user interface of the system.

FIG. 2 shows an example of the GUI of the (client) system for performing the method, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art, e.g. one such operation/function being for launching the method of FIG. 1 (based on input modeled object 2000), e.g. the method of FIG. 1 alternatively being executed as a background process. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of FIG.

2, the data 2500, displayed as a "feature tree", and their 3D representation 2000 pertain to a brake assembly including brake caliper and disc. The GUI may further show various types of graphic tools 2130, 2070, 2080, 2400 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
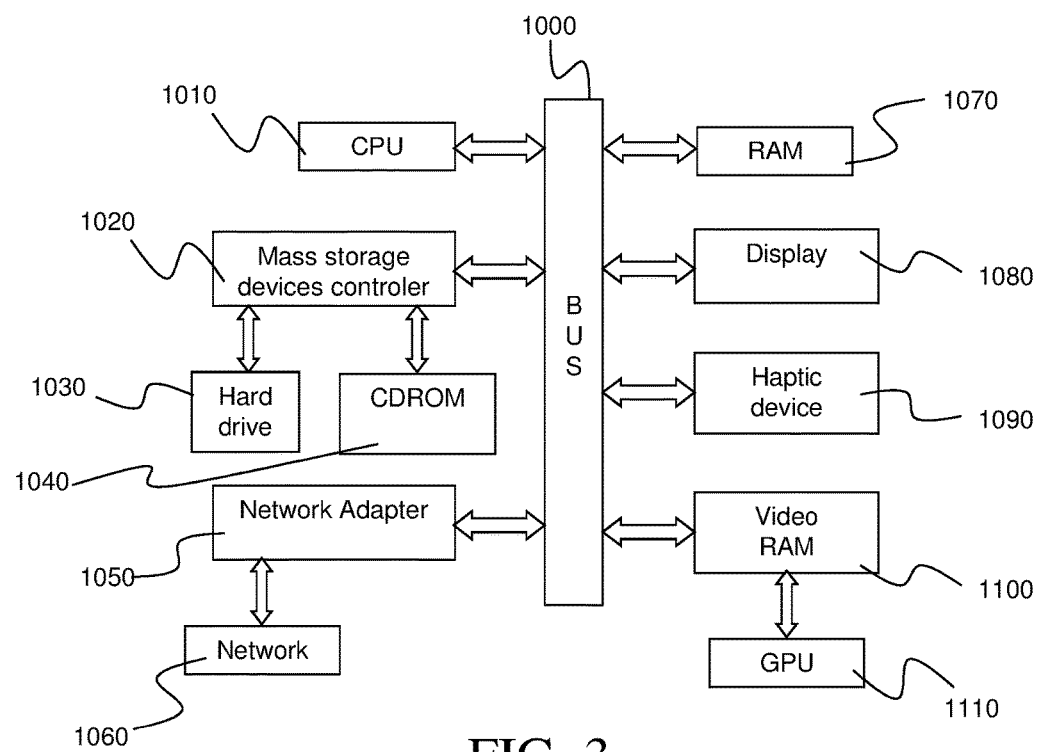
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen. The server system (possibly confounded with the client system as mentioned earlier), may be similar to the one of FIG. 3 having in addition a database for running the query and connected to BUS 1000 or located on hard drive 1030, and possibly without video RAM 1100 and GPU 1110 and/or display 1080 and/or haptic device 1090.

A computer program may comprise instructions executable by a computer, the instructions comprising means for causing the above system to perform the method of FIG. 1 and/or for constructing the database. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The method may be part of a process of designing a 3D modeled object or it may follow such process. "Designing a 3D modeled object" designates any action or series of actions which is at least part of a process of elaborating a 3D modeled object. Thus, the method may comprise creating a first 3D modeled object from scratch (by the user), e.g. via a sketching-like process. Then the method may comprise running (on user command or as an—automatic—background process) a query according to FIG. 1. Then the method may comprise optionally displaying the results to the user and selecting (by the user) a preferred result (if case there is at least one result). Finally the user may continue the design by modifying a result of the query (e.g. the one which has been selected). This can thus be useful to help a designer not unnecessarily re-design a model previously designed and re-use such previous design instead. Any other reason to perform a query according to FIG. 1 may however be contemplated. For example, the method may be used to find and e.g. delete duplicate (or almost duplicate, that is, very similar) 3D modeled objects from a database (for example in order to reduce the size of the database by eliminating redundancy).

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The method of FIG. 1 is now discussed in more details.

The method is for querying a database that comprises 3D modeled objects that represent mechanical parts. Querying a database means that a query is run on the database according to the classical meaning of such expression in database engineering, which is that information from the database is extracted from the database as the result of the query (possibly null). In the case of the method, 3D modeled objects of the database (that is, any characterizing data thereof) are returned, possibly for user-selection and/or user-triggering of additional data to be downloaded. This is all known per se in the field of database engineering, and notably in its application to 3D similarity search.

As known, the query may be performed according to any type of criterion or any types of criteria. Results are then provided (one, several, or null) based on the extent to which pieces of data in the database respect the criterion/criteria, which is very classical. In the case of the method, the query includes at least a so-called likeness criterion (possibly said likeness criterion only), in other words a criterion related to a likeness. That means by definition that an extent to which potential results (at this point, data pieces of the database) match this criterion (the question of handling several criteria, for example with weights in the query, being left aside as this is an implementation detail that can be classically addressed) is evaluated to assess whether or not a piece of information is to be considered as a result or not. How exactly this extent may be evaluated is a matter of implementation. This extent may be binary (a 3D modeled object's shape descriptor value respects the likeness criterion or not), or it can be progressive (strictly more than two levels of respect, possibly a continuum from a minimal—e.g. zero—value to a maximum value, e.g. 1—e.g. corresponding for example to two identical shape descriptor values when the criterion is that results be as identical to the input). Also, how exactly it is decided that a respective 3D modeled object is a result to be returned or not based on said extent evaluated for said respective 3D modeled object is a matter of implementation too. In examples, the method may return only a predetermined number of the most relevant results (e.g. 3D modeled objects "respecting" the likeness criterion more than the others), or only one (e.g. the "most respecting" one). In an example discussed later, the extent to which the likeness criterion is respected is a binary value and, in that example, the method may return all "respecting" 3D modeled objects—which does imply that all results are displayed to the user, at least at once, e.g. a scrolling action from the user possibly being required for that).

Now, the likeness criterion is related to the likeness of 3D objects of the database relative to the input 3D object. The definition of such likeness is provided below, and it can be said that it is closely linked to the definition of the predetermined shape descriptor, determined (e.g. calculated) in the context of the method for all considered 3D modeled objects. The "likeness" in the method (also called "similarity") is a proxy/measure of the real (observed by the user) 3D similarity/likeness defined earlier. By definition, the likeness of a first value of the predetermined shape descriptor relative to a second value of the predetermined shape descriptor increasingly depends on (i.e. it is an increasing function of) an extent to which the set of axis systems of the second value of the predetermined shape descriptor matches the set of axis systems of the first value of the predetermined shape descriptor modulo a same similarity transformation. At this point, it can be said that the likeness may be any such increasing function (examples are provided later). The likeness criterion is thus any criterion related to such measure (for example a threshold to be achieved or not to be achieved, or a range). How said matching extent can be measured exactly will be illustrated later, but here it can be said that the function of the likeness value is to measure how two 3D modeled objects are alike one another from a 3D geometry point of view and modulo a similarity transformation, since the predetermined shape descriptor is precisely a description of the 3D shape of a 3D modeled object in the context of the method where it is modeled (notably) at least by a 3D mesh there should be an almost matching in case shapes are alike.

The likeness criterion is thus all the more respected as 3D modeled objects of the database (or portions or assemblies thereof, since such portions and assemblies can be seen as 3D modeled objects themselves) are alike the input 3D modeled object (or a portion thereof, as a portion of an input can be seen as the input itself if the system offers the adequate functionality). This likeness corresponds to a geometrical similarity (not to be confused with similarity transformations, which are geometrical operations) between 3D objects. The likeness criterion may thus also be referred to as "similarity criterion" in the following.

As mentioned earlier, the 3D modeled objects of the database and the input 3D modeled object are each defined at least by a 3D mesh. This definition may however be purely intrinsic, as the querying may be performed as long as the shape descriptor value for the input 3D modeled object (the one being searched) and the shape descriptor value for the 3D modeled objects of the database (the ones to be tested as potentially to be returned, if they are alike—or "similar"—to the input object according to the likeness criterion) are provided and correctly organized (in an example, the method may be performed without any data on the 3D meshes). A mesh designates any graph structure, with vertices (3D positions) and edges (e.g. segments, straight or curved) linking vertices two-by-two. In the context of the method, the vertices and the edges form faces that represent (geometrically) the envelop (i.e. outer surface) of the mechanical part represented by the 3D modeled object. The boundary representation format (B-Rep) is a typical kind of mesh contemplated by the method, but other types of meshes (such as tessellations or CGR—Catia Graphic Representation—) may also be contemplated.

In this context, the method uses a shape descriptor, that one whose value is defined as including (at least, since additional descriptive data is possible, as in examples discussed later) a specific set of trihedral axis systems (i.e. triplets of vectors forming a trihedron). As mentioned earlier, the set of axis systems is defined such that there is one axis system per vertex and per face (i.e. per vertex/face pair). Also, each axis system is defined according to a predetermined and consistent scheme. In specific, the axis of a respective axis system are oriented in a specific way. An example will be provided later (without any loss of generality regarding merely mathematical variation leading to the same result, e.g. by a consistent translation and/or a consistent rotation). Here it can be said that the orientation is based (meaning that a convention of orientation is consistently applied) at least on the directions, at the respective vertex, of the edges (of the 3D mesh) connected to the respective vertex, on a direction, at the respective vertex, normal to the envelop of the mechanical part represented by the 3D modeled object (at the respective vertex, said normal direction being defined in the data of the 3D modeled object—e.g. associated to the 3D mesh e.g. at the respective vertex—or retrievable or proxiable from such data), and on an orientation (on the earlier-defined normal direction) of the face that corresponds to the outside of the mechanical part (e.g. an arrow pointing toward the outside of the solid defined by mechanical part at the respective vertex on the normal direction, it being clear that modulo an inversion of the computations the orientation may be seen as also corresponding to the inside of the mechanical part, the orientation in fact simply pointing to such "outside" and "inside", the method being therefore applicable to open skins as well provided that an arbitrary orientation is selected). Furthermore, the axis systems may be (all) normed or not. In an example provided later, the axis systems are not normed but they are accompanied by an additional data indicative of the global size of the 3D modeled object. In an alternative, the shape descriptor value may consist exactly of the set the axis systems, with the lengths of the axis (e.g. being the same for all axis of a given shape descriptor value) conveying said global size data.

According to this geometry framework, a second 3D modeled object is all the more similar or alike a first 3D modeled object in the sense of the likeness (e.g. the second object being a tested 3D modeled object of the database, tested to be returned as a result or not when the query is performed based on the first object as input) as the set of axis systems of the value of the predetermined shape descriptor for the second object matches the set of axis systems of the value of the predetermined shape descriptor for the first object, and this modulo a same similarity transformation. In other words, the method (virtually) looks for a (single, "same") similarity transformation (that is, a geometrical transformation of given types, that is known per se but will be discussed in details later) that transforms as many (virtually or approximately "all") axis systems as possible from the shape descriptor of the second object into axis systems that match (geometrically), e.g. exactly or with a predetermined tolerance, those of the shape descriptor of the second object. The extent of the matching can be generally measured in any way, as long as it is reasonable from a geometrical point of view, a full matching (i.e. maximum extent) corresponding to the situation where there is a similarity transformation that transforms one set of axis systems exactly into the other set of axis systems. It is noted that in this measurement, the "best" similarity transformation may be contemplated (i.e. the one that achieves the maximum extent of matching). In other words, the extent of matching may be the maximal extent of matching on a space of potential similarity transformations (e.g. the space of all similarity transformations in an example).

In an example, the fact that a respective axis system of the second value of the predetermined shape descriptor matches a respective axis system of the first value of the predetermined shape descriptor modulo the given similarity transformation weights in the extent to which the set of axis systems of the second value of the predetermined shape descriptor matches the set of axis systems of the first value of the predetermined shape descriptor, only if the face that is associated to the respective axis system of the second value of the predetermined shape descriptor matches the face that is associated to the respective axis system of the first value of the predetermined shape descriptor modulo the given similarity transformation. In other words, the method of the example considers axis systems matches only on a face-by-face basis (that is, the axis systems associated to a face of the input are considered to all match the axis systems associated to a respective face of the result, with no exception, if there is match between said faces, otherwise it is considered that there is no match at all for the axis systems of said face of the input). Now, a first face may be considered to match a second face if all axis systems associated of the first face match the axis systems associated to the second face (modulo a given similarity transformation). Further conditions (an example being discussed later in relation to the "full shape descriptor" notion) may or may not be required.

In such case, the extent to which the set of axis systems of the second value of the predetermined shape descriptor matches the set of axis systems of the first value of the predetermined shape descriptor can then be simply evaluated for a given similarity transformation as a ratio (calculated in any way, e.g. as number ratio or as an area ratio) of the faces associated to axis systems of the second value of the predetermined shape descriptor that match faces associated to axis systems of the first value of the predetermined shape descriptor modulo the given similarity transformation.

In this example, the likeness of a first value of the predetermined shape descriptor (i.e. for a "first" input 3D modeled object) relative to a second value of the predetermined shape descriptor (i.e. for a "second" 3D modeled object, belonging to the database and being tested) is equal to (or a proxy of) the maximum, over a predetermined space of possible similarity transformations (possibly all similarity transformations), of the ratio of (the number of) faces of the 3D mesh of the first object (on the total number of faces of the 3D mesh of the first object) that are evaluated in the method to perfectly match faces of the faces of the 3D mesh of the second object modulo a same given possible similarity transformation of the space (that is, the argument of the optimization program). Optionally, weights corresponding to face areas may be introduced in the ratio calculus. Now, a necessary condition to have such perfect match between a first face and a second face may be that all axis systems associated to the first face perfectly match all axis systems of the second face when transformed by said given possible similarity transformation. As also discussed later, such necessary condition may also be sufficient, but it may alternatively only serve as a first filter, other conditions then having to be assessed. In other words, in this example, a perfect match is assessed on a face-by-face basis, and then ratio of perfectly matching faces is assessed. If this ratio is above a predetermined threshold (70% in tested implementations) then the first object may be considered alike or similar to the second object. Alternatively, a progressive level of likeness (e.g. taken from strictly more than two values, e.g. from a continuum) may be provided as corresponding to the above-mentioned ratio. This face-by-face analysis allows the outputting of more relevant results (from a mechanical design point of view), compared to a mere global ratio of matching axis systems (which may however alternatively be implemented).

The value of the specific shape descriptor of the method is thus relatively small in terms of memory size (only vectors) and it can be determined relatively fast. The value of the shape descriptor for a given 3D modeled object captures the geometry of the 3D modeled object and local information on its surface (by the use of normal and orientation information in the orientation of the local axis systems). The likeness of two 3D models can consequently be assessed fast. The shape descriptor can be used as the sole comparison tool, but it can also be used as first filter (to reduce later comparisons with another refined shape descriptor, which the method may also include). The specific mathematics at use appear particularly judicious in the field of mechanical design, leading to relevant results to be provided (from the 3D geometrical similarity point of view). Also, the likeness retained maintains canonicity of the surfaces under comparison, which indirectly relates to the mechanical function of the parts represented by said surfaces or to their manufacturing process. In other words, the shape descriptor contemplated by the method focuses on the geometrical information that matters, from a mechanical design point of view.

In an implementation, the method of FIG. 1 may be performed according to the following:
  S1: a query that includes the shape descriptor value of the input 3D modeled object is provided together with a threshold ratio (or alternatively a range of ratios). The shape descriptor value contains at least axis systems and vertex-and-face-association data (thus, some topological data).
  S2: returning null, one or several results, according to the following process, performed for each 3D modeled object of the database (possible pre-orderings and/or pre-filtering being out of the present discussion):
    For each face of the test input 3D modeled object (a pre-ordering based on the complexity of the face, as mentioned later, may be applied):
      For each face of the candidate 3D modeled object of the database (same pre-ordering as before may be applied; also, optionally a filtering out of faces that do not have the same complexity—e.g. same number of vertices and/or same configuration of knife/smooth vertices—may be applied):

For each similarity transformation type of predetermined set of types (e.g. all types mentioned in the later discussion, optionally pre-ordered as they appear in the later discussion)
Searching, in a predetermined way (examples provided later), a candidate similarity transformation of the type that ensures a (e.g. perfect) match between the shape descriptor of the face of the test input and the shape descriptor of the face of the candidate. It may here be verified that all axis systems of one face has a match in the other face. Also, it may here be verified that the relevant dimensions match each other according to the candidate similarity transformation (e.g. modulo the scaling of such transformation). This is the light shape descriptor part mentioned later. Optionally, it may further (and if the previous verifications are positive) be verified that a sampling of the face of the test input matches a sampling of the candidate modulo the candidate transformation (the same type of sampling being used, e.g. by mere distance comparisons).
If no candidate transformation has been found, exiting the For loop and going to another face (if all faces have been traversed, going to another object of the database).
If a candidate transformation has been found: verifying that it ensures a match (in the same way as when searching for the candidate transformation) for a ratio of faces higher than the threshold
If so, returning the candidate object as a result. Else, looking for a new candidate transformation.

Other examples of the method of FIG. 1 (that may be combined with any of the above and also between them) are now discussed with reference to FIGS. 4-31.

A general example of implementation of the method is now discussed with reference to FIG. 18, that may be combined with the examples discussed in reference to objects defined by B-Reps.

In the general example, the method is based on a definition of a shape descriptor for a solid (or a skin) model. This shape descriptor is based on local axis systems attached to vertices of the solid as defined in the any of the examples mentioned above. The shape descriptor is not invariant under 3D transformations, but this issue is taken into account by a comparison algorithm, that runs as module of the method of the example.

The input data of the comparison algorithm include a test solid, a candidate solid, a similarity type and a similarity criterion (i.e. the likeness criterion). The similarity type may be chosen (in the algorithm, i.e. in a predetermined way) among: rigid motion, reflection, positive scaling, and negative scaling. The comparison algorithm of the example runs two steps iteratively. The first step is to compute a candidate similarity transformation that may (partially) transform the test solid into the candidate solid. This step involves the similarity type, but not the similarity/likeness criterion. The second step checks if the candidate similarity transformation actually transforms a sufficiently large portion of the test solid into the candidate solid (corresponding to the "ratio" mentioned earlier). This step involves the similarity/likeness criterion in case this criterion is a threshold ratio. If the answer is "yes", test and candidate solids are considered similar and the algorithm stops. Otherwise, a new candidate similarity transformation is searched. FIG. 18 illustrates the iterative process. If the algorithm outputs that test solid and candidate solid are not similar, a new search can be performed using another similarity type.

In an example, at the step of testing a candidate similarity transformation, said tested candidate may be obtained by looking first at most complex faces (the complexity being an increasing function of the number of knife/smooth vertices and/or the number of vertices of vertices of the face). This is because fewer candidate similarity transformations will be possible on such faces (since they are complex and less likely to lead to a match with a random similarity transformation), thereby achieving a sort of filtering.

The 3D modeled objects of an example (input at S1 and searched in the database and returned at S2) are now discussed.

In the example, the B-Rep of said modeled objects is contemplated as the 3D mesh defining them. The boundary representation is a widely known format for modeling a 3D object in terms of its envelop (i.e. its outer surfaces). The B-Rep thus designates data of a specific format that may comprise geometrical data and topological data. Geometrical data are data that provide geometrical entities, which are entities described in terms of 3D positions. Topological data are data that provide topological entities, which are entities described in terms of references to geometrical entities and/or relationships with other topological entities, e.g. relative positioning. Typically, the relationships may include an "is bounded by" relationship that associates a topological entity to other topological entities by which they are topologically bounded.

In the case of the example, the (e.g. geometrical) data may include at least so-called "supporting surfaces", for example parametric surfaces (i.e. 3D surfaces modeled in terms of 3D positions associated to parameters defining a 2D domain). The supporting surfaces may typically be NURBS surfaces, but also planar, canonical or procedural surfaces. And the (e.g. topological) data include at least a set of faces, each face being defined as a bounded portion of a respective supporting surface (provided in the geometrical data). Thus, a face corresponds to a trimmed surface. The supporting surfaces are thus surfaces on which the faces are defined (thereby "supporting" the faces), in any way, by a trimming operation.

The notion of B-Rep, although widely known, is now further discussed through an example of a modeled object that may be provided at S1. Other examples of B-Reps, for example with relationships different from the "is bounded by" relationship, for at least some topological entities, may however be contemplated by the method.

As already mentioned, a B-Rep of a modeled object may include topological entities and geometrical entities. The geometrical entities may comprise 3D objects that are surfaces (e.g. planes), curves (e.g. lines) and/or points. Surfaces may be provided as functions of two parameters. Curves may simply be provided as functions of one parameter. And points may be provided as 3D coordinates. The topological entities may comprise faces, edges, and/or vertices. By its definition, a face corresponds to a bounded portion of a respective surface, named the supporting surface. The term "face" may thus indifferently designate such bounded portion of the surface or the corresponding bounded portion of the 2D domain. Similarly, an edge corresponds to a bounded portion of a curve, named e.g. the supporting curve. The term "edge" may thus designate such bounded portion of the curve or of its domain. A vertex may be defined as a link to a point in 3D space. These entities are related to each other as follows. The bounded portion of a curve is defined by two points (the vertices) lying on the curve. The bounded portion of a surface is defined by its boundary, this boundary being a set of edges lying on the surface. Edges of the face's boundary are connected together by sharing vertices. Faces are connected together by sharing edges. By definition, two faces are adjacent if they share an edge. Similarly, two edges are adjacent if they share a vertex. Surfaces, curves, and points may be linked together via their parameterization. For example, a value of the parameter of the parametric function defining a curve may be provided to define a bounding vertex. Similarly, a function linking the parameter of a curve to the two parameters of a surface may be provided to define a bounding edge. However, the very detailed structure of such topological data of a B-Rep is out of the scope of the present explanations.

Figure 4:
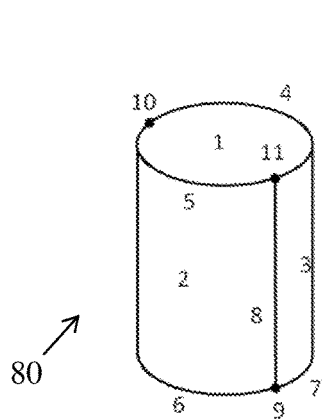
Figure 5:
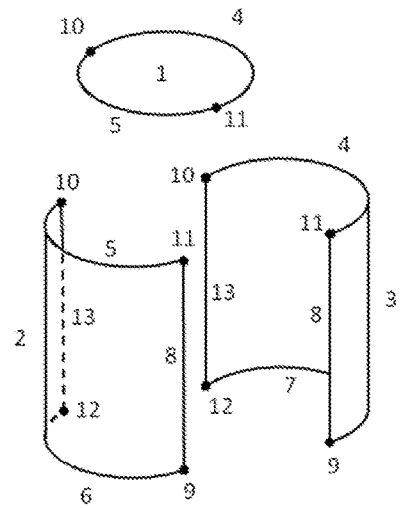

FIGS. 4 and 5 illustrate the B-rep model of a cylindrical slot 80 that may be the modeled object provided at S1 and that is made of three faces numbered 1, 2 and 3 on the figures: top planar face 1 and two lateral cylindrical faces 2 and 3. FIG. 4 shows a perspective view of slot 80. FIG. 5 shows the exploded view of all faces. Duplicated numbers illustrate edges and vertices sharing. Face 1 is a bounded portion of a plane. Boundary of face 1 includes edges 4 and 5, each of them being bounded by vertices 10 and 11. They both have the same supporting circle. Face 2 is bounded by edges 6, 8, 5 and 13 all lying on an infinite cylindrical surface (i.e. the supporting surface of face 2). Faces 1 and 2 are adjacent because they share edge 5. Faces 2 and 3 are adjacent because they share edges 8 and 13. Faces 1 and 3 are adjacent because they share edge 4.

FIG. 6 illustrates the "is bounded by" topological relationship of the B-rep model of slot 80. Nodes of higher layer 101 are faces, nodes of intermediate layer 103 are edges and nodes of lower layer 105 are vertices. FIGS. 7 and 8 illustrate the relationship between topological entities (faces, edges, vertices) and the supporting geometries (infinite cylinder, infinite plane, infinite line, points). In the CAD system, the B-rep model gathers in an appropriate data structure the "is bounded by" relationship and the relationship between topological entities and supporting geometries, and mathematical descriptions of supporting geometries. In other words, the data structures shown on FIGS. 6 and 7 are part of the topological data of this example, which comprise links to geometrical entities of the geometrical data (this is FIG. 7) and links between topological entities (this is FIG. 6).

Different mathematical notions, notations and definitions used in the method of the examples are now discussed.

The identity mapping $\mathbb{R}^3 \to \mathbb{R}^3$ is noted $$I = \begin{pmatrix} 1 & 0 & 0 \\ 0 & 1 & 0 \\ 0 & 0 & 1 \end{pmatrix}.$$

A point-set is a subset of the three-dimensional space $\mathbb{R}^3$.

By definition, a 3D transformation (or transformation for short) is a mapping D: $\mathbb{R}^3 \to \mathbb{R}^3$ defined by $D(x)=Lx+T$ where L is a linear mapping and T is a translation vector. For computational purpose, transformation D is advantageously represented by a 4×4 matrix including matrix L and translation vector T. Noting:

$$L = \begin{pmatrix} l_{11} & l_{12} & l_{13} \\ l_{21} & l_{22} & l_{23} \\ l_{31} & l_{32} & l_{33} \end{pmatrix}$$

$$T = \begin{pmatrix} t_1 \\ t_2 \\ t_3 \end{pmatrix}$$

The 4×4 matrix is $$D = \begin{pmatrix} l_{11} & l_{12} & l_{13} & t_1 \\ l_{21} & l_{22} & l_{23} & t_2 \\ l_{31} & l_{32} & l_{33} & t_3 \\ 0 & 0 & 0 & 1 \end{pmatrix}$$

Which is also noted, for short, $$D = \begin{pmatrix} L & T \\ 0 & 1 \end{pmatrix}$$

Position of a point $x \in \mathbb{R}^3$ is computed as follows. The first three coordinates of the resulting point are meaningful because the fourth one is always 1.

$$D(x) = \begin{pmatrix} L & T \\ 0 & 1 \end{pmatrix} \begin{pmatrix} x \\ 1 \end{pmatrix} = \begin{pmatrix} Lx + T \\ 1 \end{pmatrix}$$

This way, compositions and inversions of transformations are performed using 4×4 matrix algebra. Indeed, $$DD' = \begin{pmatrix} L & T \\ 0 & 1 \end{pmatrix} \begin{pmatrix} L' & T' \\ 0 & 1 \end{pmatrix} = \begin{pmatrix} LL' & LT' + T \\ 0 & 1 \end{pmatrix}$$

and $$D^{-1} = \begin{pmatrix} L & T \\ 0 & 1 \end{pmatrix}^{-1} = \begin{pmatrix} L^{-1} & -L^{-1}T \\ 0 & 1 \end{pmatrix}$$

A rotation is defined by an axis and an angle. A reflection changes a point-set into its mirror image with respect to a plane. The matrix of a reflection is $I-2NN^T$, where N is the unit normal vector of the mirror plane. Rotations and reflections are isometries because they save the scalar product. If L is a rotation in expression $D(x)=Lx+T$, then D is a rigid motion.

A uniform scaling changes a point-set into a larger or smaller point-set and saves proportions. More precisely, a uniform scaling S multiplies distances by a positive coefficient: $\|Sx-Sy\|=\lambda\|x-y\|$ where $\lambda>0$. The matrix L of a uniform scaling is equivalent to $\lambda I$.

Conversely, a non-uniform scaling does not save proportions as its L matrix is equivalent to $$\begin{pmatrix} a & 0 & 0 \\ 0 & b & 0 \\ 0 & 0 & c \end{pmatrix}$$

where a, b, c>0 are not equal. This transformation is out of the scope of the invention.

A similarity transformation (or similarity for short) is a combination of rotation, uniform scaling or reflection. A positive similarity is a transformation such that $\det(L)>0$. A negative similarity is a transformation such that $\det(L)<0$. A rigid motion is such that $\det(L)=1$. Intuitively, a positive similarity does not involve a reflection, and a negative similarity does involve a reflection.

A similarity is invertible because rotation, uniform scaling and reflection are invertible linear mappings. Then, $y=D(x)$ is equivalent to $x=D^{-1}(y)$ where $D^{-1}(y)=L^{-1}y-L^{-1}T$.

Two point-sets X and Y are said to be similar if there exists a similarity D such that $Y=\{D(x), x \in X\}$, which is noted $Y=D(X)$ in short.

The previous concepts apply (but are not restricted) to the faces of a solid or 3D mesh. Faces of the solid's B-rep play the role of point-sets.

A face of a solid is defined by a supporting plane or surface and by boundary edges. The face is equipped with the outer normal vector of the solid. The boundary edges are oriented according to this normal vector. Boundary edges are connected by sharing vertices.

The shape descriptor, the set of axis systems included in its value, and examples of tools to assess extent to which the set of axis systems of a second value of the predetermined shape descriptor matches the set of axis systems of a first value of the predetermined shape descriptor modulo a same similarity transformation (and thus to measure likeness between a second 3D modeled object corresponding to the second value with a first 3D modeled object corresponding to the first value, and consequently measure the extent to which the likeness criterion is respected) adapted to the B-Rep example are now discussed.

In order to perform comparisons between 3D models (i.e. measurement of likeness) and to find the similarities (i.e. the geometrical transformations considered when—virtually—assessing if a 3D model can be transformed into another one with such a geometrical transformation), each face is equipped with several axis systems (i.e. the shape descriptor). At each vertex v of the face (again, when a vertex belongs to several faces, which is often the case, the operation is repeated), an axis system may be created (by the method of FIG. 1, prior to S1, or during construction of the database as an initial step) as in the following example. The coordinates of the origin point P are the coordinates of the vertex v. First vector, noted U, is tangent to the input boundary edge of v and such that −U is oriented like the boundary edge. Second vector, noted V, is tangent to the output boundary edge of v and is oriented in the boundary edge direction. Words "input" and "output" are related to the topological orientation of the boundary edges according to the normal vector of the face. The third vector is the outer normal vector N of the face computed at vertex v. Despite N is always perpendicular to U and to V, it should be noticed that the axis system (P, U, V, N) is not generally direct and orthogonal. Nevertheless, vectors U, V, N may be normalized in an example (also mentioned earlier), meaning that $\|U\|=\|V\|=\|N\|=1$.

FIGS. 9-11 illustrate the axis systems of a semi-cylindrical face 90. FIG. 9 shows face 90 and its normal vector 92. FIG. 10 shows the topological orientation of boundary edges 94 induced by normal vector 92. Boundary edge a is an input edge of vertex v. Boundary edge b is an output edge of vertex v. FIG. 11 displays vectors U, V, N of axis systems at each boundary vertex.

Figure 12:
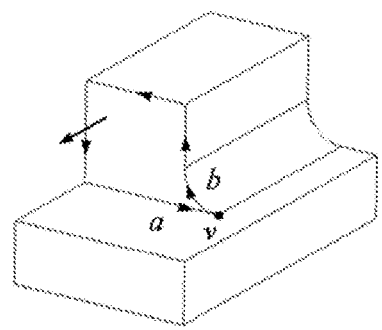
Figure 13:
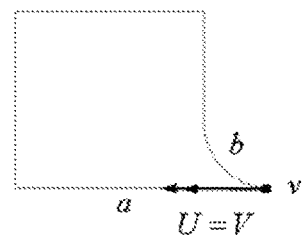
Figure 14:
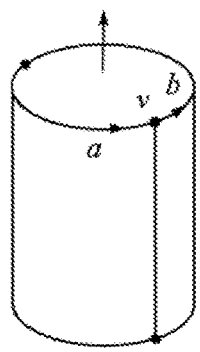
Figure 15:
Figure 16:
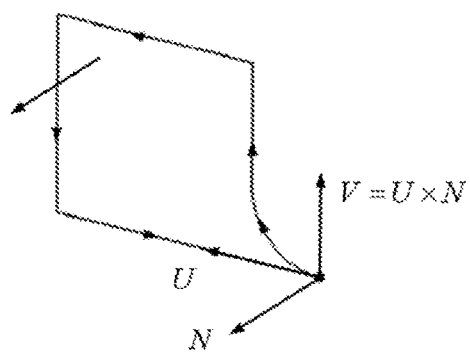
Figure 17:
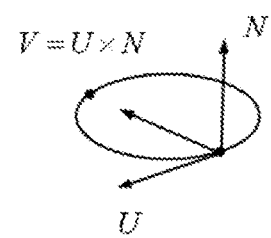

The axis system (P, U, V, N) is not degenerated as long as the edges incident to the vertex are not tangent (which is the general case), meaning that vectors U and V are not collinear. If incident edges are tangent in opposite directions, then U=V. Such a vertex may be called a knife vertex, as illustrated in FIGS. 12-13. FIG. 12 shows that edges a and b are incident to vertex v and are tangent to each other in opposite directions. FIG. 13 illustrates that vectors U and V are degenerated at vertex v because U=V. If incident edges are tangent in the same direction, then U=−V and the vertex is called a smooth vertex, as illustrated in FIGS. 14-15. In FIG. 14, edges a and b are incident to vertex v and are tangent to each other in the same direction. FIG. 15 illustrates that vectors U and V are degenerated at vertex v because U=−V. In these two cases, a non-degenerated axis system may be advantageously built by keeping P, U, N as previously defined and by setting vector V as the cross product of U and N, that is V=U×N, as illustrated in FIGS. 16-17. This specific and example management of degenerated vertices provides more accurate/relevant results during the querying.

All vertices of all faces may be further labelled "smooth", "knife" or "sharp" in the shape descriptor value. By definition, a sharp vertex is one that is neither smooth nor knife. This typing can be used to accelerate local axis systems correspondence (during evaluation of the likeness) in an example, because a similarity transformation can be seen as always changing a vertex of a given type into another vertex of the same type. Consequently, if two vertices v, w do not have the same type it can be considered by the method that there exists no similarity that can change the local axis system $(P_v, U_v, V_v, N_v)$ of v into the local axis system $(P_w, U_w, V_w, N_w)$ of w. The same acceleration may applied with the angle between tangents of the two edges at a given vertex. This angle can be considered as to be unchanged by any contemplated similarity. So, if two vertices v, w do not have the same angle, it can be considered by the method that there exists no similarity that can change the local axis system of v into the local axis system of w.

Where the axis systems are designed to be matched and thereby translate the matching of geometrical details between two 3D models (as said details are kept through a similarity transformation), it must be remembered that a similarity transformation may comprise a scaling that maintains proportions but modifies distances. Such scaling must be tracked when searching for a similarity transformation.

This can be performed via a so-called "Relevant dimension of a face". By definition, the relevant dimension of a face is a scalar quantity measured on the face that depends on its size, but not on its position. It is dedicated to deal with size changes when searching uniform scaling. The area of the face can be its relevant dimension. Similarly, the relevant dimension λ of a face f can be the diameter of its set of vertices. More precisely, noting $\{P_i, i=1, \ldots, p\}$ the set of vertices of f then $\lambda = \max\{\|P_i - P_j\|, i,j=1, \ldots, p\}$. This relevant dimension can be stored in the shape descriptor value as a scalar value apart (which is the most efficient way of doing so), or it can be used as factor to apply to the axis systems vectors (which are then not normed anymore).

Anisotropy is now discussed.

Given a face f, its two anisotropy factors $a_1$ and $a_2$ are defined as follows. Firstly, the matrix of inertia M of face f is computed with respect to the canonical axis system. Then eigenvalues $v_1$, $v_2$ and $v_3$ of matrix M are computed by using the characteristic equation $\det(M-vI)=0$. If $v_i$ are three distinct numbers, they are ordered so that $v_1 < v_2 < v_3$ and the anisotropy factors are:

$$a_1 = \frac{v_1}{v_3}$$

$$a_2 = \frac{v_2}{v_3}$$

If at least two eigenvalues $v_i$ are equal, anisotropy factors are not meaningful. This is because, in this situation, principal inertia axis system is not uniquely defined. The principal inertia axis system of face f is noted $(G, A_1, A_2, A_3)$. By definition, point G is the center of inertia of face f and vectors $A_i$ are eigenvectors of inertia matrix M respectively associated with eigenvalues $v_i$, meaning that $MA_i=v_iA_i$. Vectors $A_i$ are normalized and oriented so that the principal inertia axis system is direct.

The shape descriptor may be seen as a list of its face shape descriptors (for all faces of the 3D modeled object), which can themselves each be a so-called "light shape descriptor" or a "full shape descriptor" of a respective face. The light shape descriptor is lighter in terms of memory size, and as it contains less information, it leads to a faster decision. The full shape descriptor allows more accurate evaluations. The light shape descriptor can be used in the context of a remote client-server communication, to avoid overloading the network. It can alternatively or additionally be used to limit the number of similarity transformations assessed in the method (i.e. it can serve as a first filtering).

By definition, the light shape descriptor s(f) of a face f is the type of its support surface (plane, cylinder, sphere, cone, torus, extrusion, revolute, freeform) together with the list of local axis systems defined at vertices and its relevant dimension $$s(f)=(\text{Type},\{(P_i,U_i,V_i,N_i), i=1,\ldots,p\},\lambda)$$

where p is the number of vertices of face f and Type∈{Plane,Cylinder,Cone,Sphere,Torus,Extrusion,Revolute,Free form}

This descriptor may be enhanced (in examples) by adding anisotropy factors and principal inertia axis system, when they are meaningful.

$$s(f)=(a_1,a_2,(G,A_1,A_2,A_3),\text{Type},\{(P_i,U_i,V_i,N_i), i=1,\ldots,p\},\lambda)$$

Thus, by definition, the light shape descriptor s(A) of a solid A including n faces $\{f_1, \ldots, f_n\}$ is the list of face's light shape descriptors:

$$s(A)=\{s(f_1), \ldots, s(f_n)\}$$

But in the case of B-Reps, the value of the predetermined shape descriptor for a respective 3D modeled object may further include ("full shape descriptor" in this case) for each respective face of the respective 3D modeled object a sampling of the bounded portion of the supporting surface defined by the respective face. The sampling may be performed in any predetermined way, e.g. according to a convention that maintains proportions. For example a regular parameter grid sampling may be applied. In this situation, the likeness of a first value of the predetermined shape descriptor relative to a second value of the predetermined shape descriptor may further increasingly depend on an extent to which the samplings of the second value of the predetermined shape descriptor match the samplings of the first value of the predetermined shape descriptor modulo the same similarity transformation (and not only on the extent to which the sets of axis systems are matched one to another modulo a similarity transformation). The "light shape descriptor part" of the full shape descriptor may in such a case be the basis of a first assessment used to retain only promising similarity transformations, and the sampling comparison is then used to verify if a retained similarity transformation is indeed relevant. In other words, the likeness of a first value of the predetermined shape descriptor relative to a second value of the predetermined shape descriptor is evaluated according to an iteration of a scheme that includes, at each iteration, finding a new candidate similarity transformation and then evaluating the likeness along the candidate similarity transformation, a new candidate similarity transformation being found at each iteration based solely on axis system information. This allows a fast performance of the method, as a quick filtering is judiciously applied.

In an example, the full shape descriptor actually includes the light shape descriptor together with the face itself, including its topology and geometry (which is data already present as such in the database, as B-Reps are usually available). The full shape descriptor of a solid is the list of its face's full shape descriptors. The sampling may then be performed on the fly from the topology and geometry information of the face.

Figure 18:
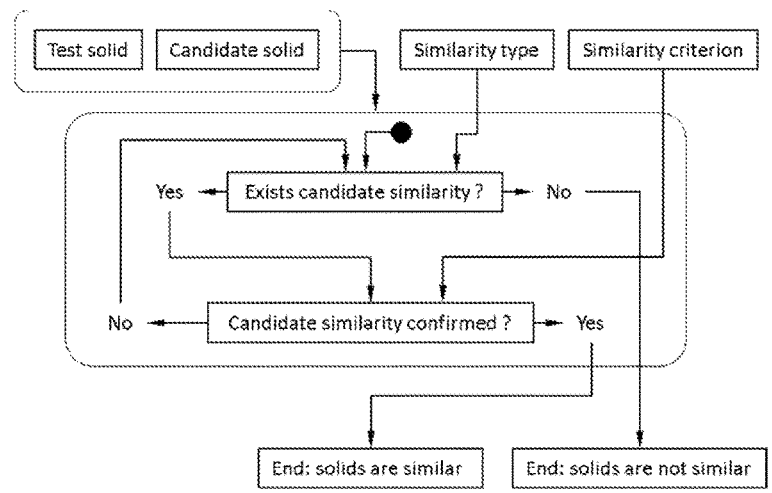

The method of the general example of FIG. 18 may be applied to such B-Reps and is thus two folded. On one hand, it defines a shape descriptor for 3D solid models. On the other hand, it provides a comparison algorithm based on said shape descriptor. The method may deal with 3D objects modeled by their boundary representation (B-rep) and designed by using mechanical features. Mechanical features are solid modeling features particularly adapted to mechanical parts. Despite these concepts are well-known, definitions and illustrations are reproduced here for clarity.

The following discussion applies to the case where the 3D modeled objects of the database and/or the input 3D modeled object are user-defined according to a mechanical design process. This design process may be respectively prior to the method (e.g. as part of the method) and/or prior to the construction of the database (e.g. as part of the database construction process). Such mechanical design processes may involve different designers. But the field of mechanical design leads to some common rules being applied.

The mechanical design process may include (incremental) definitions of solid modeling mechanical features. Particularly useful solid modeling features for mechanical design are the following ones. The system, a feature-based CAD system, may therefore provide for definition of any or several of such features. A mechanical design process may thus involve one or several instances of any or several of the following features.

Sketch based features are defined by a planar profile that is extruded along a direction, rotated around a line or swept along a guide curve. They are respectively named: linear extrusion, revolute and swept solid.

A Boolean operation (feature) is to create a new solid by combining two solids using union, subtraction or intersection operations. Cutting a solid by a surface is also useful.

Dress-up features are local modification on a solid. They are closely related to the manufacturing process. These features are: filleting or rounding a sharp edge, chamfering a sharp edge, bending a face according to a draft angle and a pulling direction and thickening a face.

A shelling (feature) is to make a thin solid from a thick solid. It is to remove faces from the input solid and thick the resulting open skin.

These features may be instantiated with any parameters, including value or input geometry. The B-Rep of any 3D modeled object contemplated by the method may be obtained by a mechanical designer instantiating a series of such features.

Figure 19:
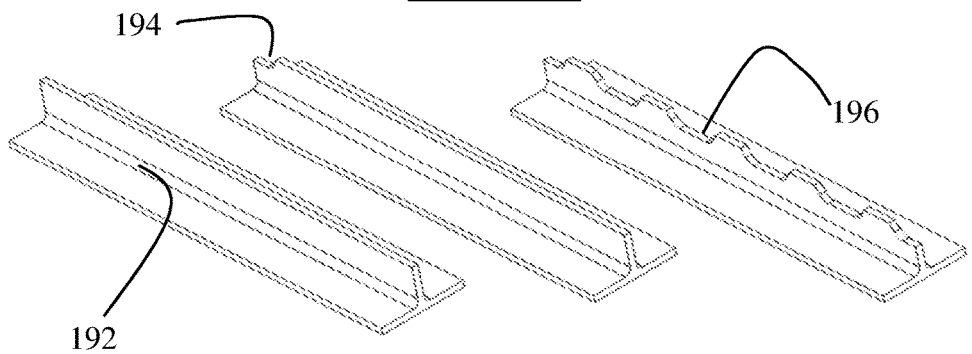
Figure 20:
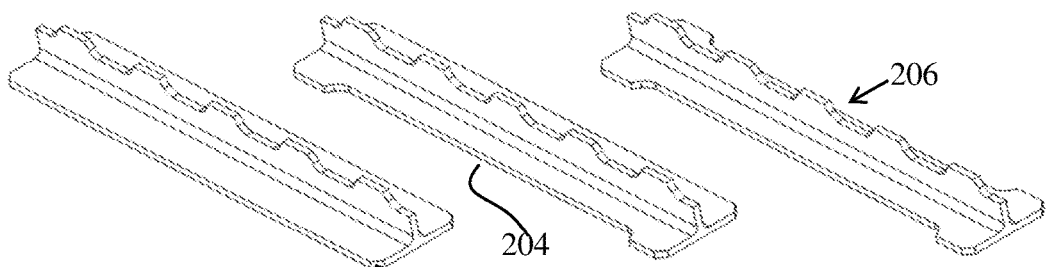

FIG. 19 illustrates an example of the design of a stringer (aerospace part to strengthen the structure of an airplane), that may be the input 3D object or a database 3D object of any example of the method of FIG. 1, sequentially from the left to the right. The sequence of features is the following: extrude 192, remove material 194 from the vertical wall and repeat 196 this remove along the extrusion direction. Next steps are shown on FIG. 20, sequentially from the left to the right: chamfering 202, removing material 204 from the left horizontal side and mirroring 206 this removal with respect to the vertical wall.

Figure 21:
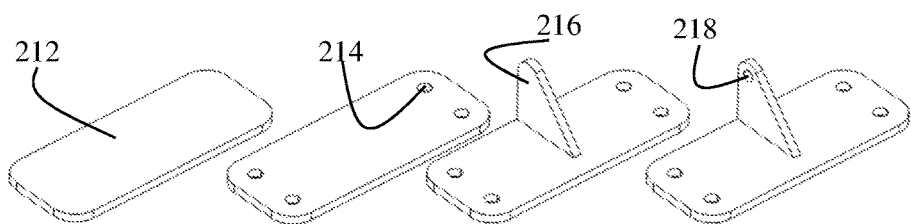
Figure 22:
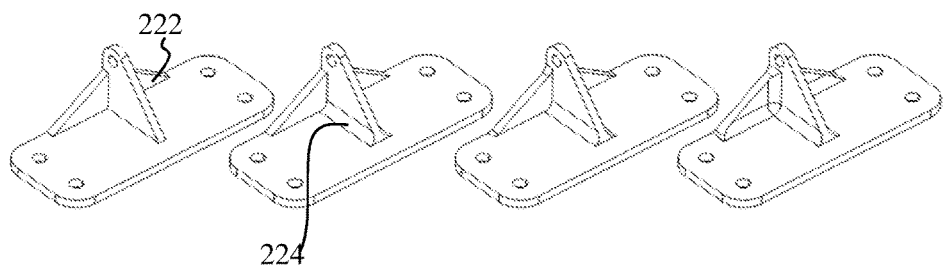

Similarly, FIGS. 21-22 illustrates an example of the sequential design of an aerospace cleat. The first design steps are: the extrusion 212 of a rectangular profile, four holes 214, extrusion 216 of a triangular profile and a hole 218 again. Notice that rounds are included in profile definitions. Next step is to add stiffeners through two extrusions 222 of triangular profiles. Last steps of the cleat design are fillets 224. They are arranged so that the final solid features the shape of part obtained by machining a stock with a cutting tool.

Examples of how to evaluate if two faces match each other modulo a given similarity transformation, in the evaluation of the extent to which the set of axis systems of the second value of the predetermined shape descriptor matches the set of axis systems of the first value of the predetermined shape descriptor may be evaluated, are now provided. In an example, this evaluation is performed in a predetermined way for a given similarity transformation type (referring to the similarity types mentioned earlier). This internal characteristic of the software/system allows a refined management of the different potential types of similarity types. This is explained below, together with a discussion on examples of how to search different candidate similarities.

Let f, g be two faces respectively equipped with (the same number of) local axis systems $S_1^f, \ldots, S_m^f$ and $S_1^g, \ldots, S_m^g$ and support surfaces having the same type. If faces f, g do not have the same number of local axis systems, it means that they do not have the same number of boundary vertices, so they may in an example be considered as not similar to each other and the similarity search is not launched.

An example of searching a similarity is performed through two steps. Firstly, compute the transformations $D_{i,j}$ respectively changing the i-th axis system of face f into the j-th axis system of face g. Since i,j=1, . . . , m, there exists at most $m^2$ such transformations. This computation depends on the type of the searched transformation: rigid motion, reflection, positive scaling, negative scaling. Secondly, the similarity D* that changes f into g, if any, is to be found among the previously computed $D_{i,j}$. This second step does not depend on the nature of the transformation.

An example of searching a rigid motion $D_{i,j}$ is now discussed.

Let $S_i^f = (P_i^f, U_i^f, V_i^f, N_i^f)$ be the i-th axis system of face f and $S_j^g = (P_j^g, U_j^g, V_j^g, N_j^g)$ be the j-th axis system of face g. The transformation $D_{i,j} = \begin{pmatrix} R_{i,j} & T_{i,j} \\ 0 & 1 \end{pmatrix}$ changing $S_i^f$ into $S_j^g$ is obtained by computing the following product.

$$D_{i,j} := \begin{bmatrix} U_i^f & V_i^f & N_i^f & P_i^f \\ 0 & 0 & 0 & 1 \end{bmatrix}^{-1} \begin{bmatrix} U_j^g & V_j^g & N_j^g & P_j^g \\ 0 & 0 & 0 & 1 \end{bmatrix}$$

Then, if $R_{i,j} R_{i,j}^T = I$, matrix $R_{i,j}$ is an isometric transformation. If, in addition, $\det(R_{i,j})=1$, then $R_{i,j}$ is a rotation, meaning that $D_{i,j}$ is a rigid motion. Otherwise, $D_{i,j}$ is not a rigid motion.

An example of searching a positive scaling $D_{i,j}$ is now discussed.

Now, the searched transformation is a positive similarity, which is the combination of a rigid motion and a uniform scaling. It takes into account relevant dimensions $\lambda_f$ and $\lambda_g$ of faces f and g as follows.

$$D_{i,j} := \begin{bmatrix} \lambda_f U_i^f & \lambda_f V_i^f & \lambda_f N_i^f & P_i^f \\ 0 & 0 & 0 & 1 \end{bmatrix}^{-1} \begin{bmatrix} \lambda_g U_j^g & \lambda_g V_j^g & \lambda_g N_j^g & P_j^g \\ 0 & 0 & 0 & 1 \end{bmatrix}$$

If $\det(R_{i,j})>0$, then $D_{i,j}$ is a positive similarity, otherwise, it is not.

An example of searching a reflection $D_{i,j}$ is now discussed.

Figure 23:
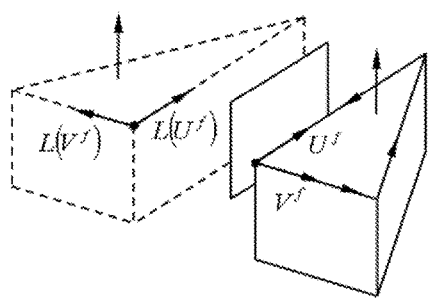

The specificity is that a reflection reverses the orientation of an axis system. FIG. 23 illustrates the phenomenon: leftmost dotted solid is the image of rightmost solid through the reflection L defined by the middle plane. The top face of the rightmost solid is noted f. Notice the vectors $L(U^f)$ and $L(V^f)$.

Figure 24:
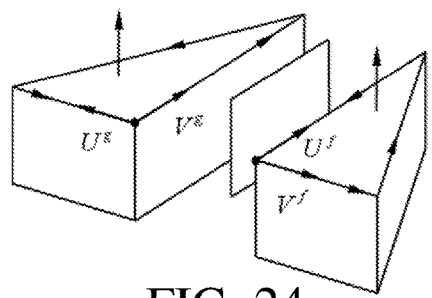

FIG. 24 illustrates two symmetrical solids and the topological orientation of their top faces. The top face of leftmost solid is noted g. By comparing with previous figure, observe that $L(U^f)=V^g$ and that $L(V^f)=U^g$. Consequently, in order to find a reflection, the topological inversion must be anticipated, meaning that $D_{i,j}$ is computed according to the following formula. Notice that $U_j^g$ and $V_j^g$ are switched on the rightmost matrix.

$$D_{i,j} := \begin{bmatrix} U_i^f & V_i^f & N_i^f & P_i^f \\ 0 & 0 & 0 & 1 \end{bmatrix}^{-1} \begin{bmatrix} V_j^g & U_j^g & N_j^g & P_j^g \\ 0 & 0 & 0 & 1 \end{bmatrix}$$

If $R_{i,j} R_{i,j}^T = I$ and $\det(R_{i,j})=-1$, then $D_{i,j}$ is a reflection, otherwise, it is not.

An example of searching a negative scaling $D_{i,j}$ is now discussed.

The computation for searching a negative scaling involves the relevant dimensions $\lambda_f$ and $\lambda_g$ of faces f and g as follows. Notice that $U_j^g$ and $V_j^g$ are switched on the rightmost matrix.

$$D_{i,j} := \begin{bmatrix} \lambda_f U_i^f & \lambda_f V_i^f & \lambda_f N_i^f & P_i^f \\ 0 & 0 & 0 & 1 \end{bmatrix}^{-1} \begin{bmatrix} \lambda_g V_j^g & \lambda_g U_j^g & \lambda_g N_j^g & P_j^g \\ 0 & 0 & 0 & 1 \end{bmatrix}$$

If $\det(R_{i,j})<0$, then $D_{i,j}$ is a negative scaling, otherwise, it is not.

An example of the searching of D* in line with the above examples is now discussed.

In order to find (among the previously computed $D_{i,j}$) the similarity transformation D* that changes f into g, the question is: given f,g and a similarity transformation D, is D(f)=g true?

If the computation is performed on the client computer, this may be done (for a relatively more accurate result) by sampling face f with a collection of 3D points $x_k$, k=1, . . . , q and by checking that the distances between points $D(x_k)$ and face g are small enough compared to the numerical threshold for identical objects. This step makes use of the full shape descriptor.

If the computation is performed on the server computer, the similarity D* is the one of the $D_{i,j}$ that changes all axis systems of face f into all axis systems of face g. In other words, the algorithm looks for a one to one mapping $\varphi:\{1, \ldots, m\} \rightarrow \{1, \ldots, m\}$ such that $D^*(S_i^f)=S_{\varphi(i)}^g$ for all $i \in \{1, \ldots, m\}$. This step makes use of the light shape descriptor. It can be shortened by using principal axis systems and anisotropy factors when they are available.

If, among the $D_{i,j}$, several similarity transformations can change f into g, then a pure translation is selected when possible. Any hierarchy of the similarity transformation types may be contemplated.

Now, an example of a comparison algorithm that may be combined with any of the above examples is now discussed.

Let n be the number of faces of the test solid and m be the number of faces of the candidate solid. Shape descriptors of test solid's faces are $\{s(f_1), \ldots, s(f_n)\}$. Shape descriptors of candidate solid's faces are $\{s(g_1), \ldots, s(g_m)\}$.

This algorithm separately implements the two steps "candidate similarity searching" and "candidate similarity confirmation" mentioned earlier with reference to FIG. 18. Roughly, each step is a double loop on $\{s(f_1), \ldots, s(f_n)\}$ and $\{s(g_1), \ldots, s(g_m)\}$.

In order to navigate freely from one "for" loop to another, the following addressing formulas are useful. Function Q(p,m) gives the integer quotient of p and m, meaning that Q(p,m) is the largest integer such that $p \geq mQ(p,m)$. Function M(p,m) gives the remainder of division of p by m. In other words:

$p=mQ(p,m)+M(p,m)$

Figure 25:
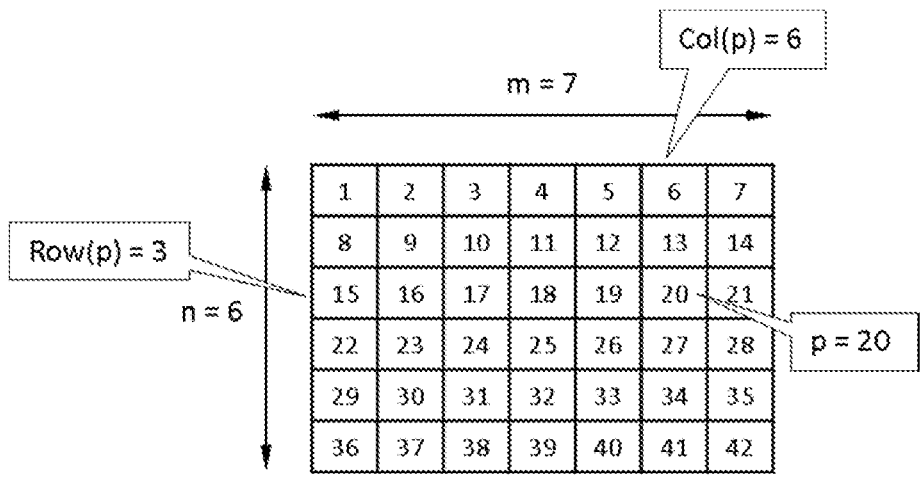
Figure 26:
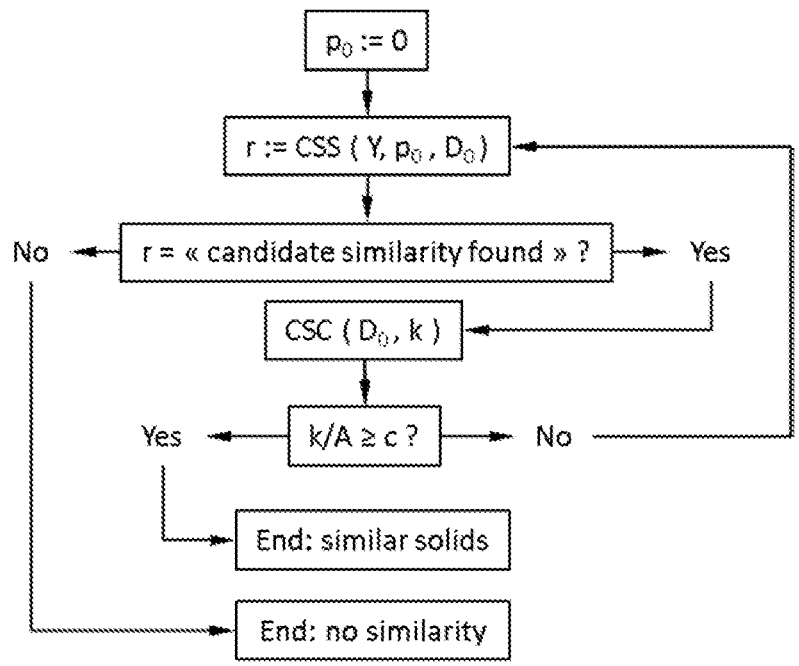

When integer p runs from 1 to nm, integer $row(p,m)=1+Q(p-1,m)$ and integer $col(p,m)=1+M(p-1,m)$ are respectively the row number and the column number of an n rows and m columns array, as illustrated in FIG. 25.

The "candidate similarity searching" CSS program may in an example involve the input type Y of the searched similarity, the input/output parameter $p_0$ for multiple calls purpose and the output parameter $D_0$ which is the found type Y similarity. The very first run of this "candidate similarity searching" program is performed with $p_0=0$. This step outputs a type Y similarity $D_0$, if any, and the corresponding index $p_0$. This index is reused when this searching is run again through a new call to the "candidate similarity searching" program. The core of the program may be as follows.

```
CSS(Y, p₀, D₀)
    q := p₀ + 1
    For p := q to nm do begin
        i := row(p, m)
        j := col(p, m)
        If exists a type-Y similarity D* such that D*(s(fᵢ)) = s(gⱼ) then
            p₀ := p
            D₀ := D*
            Return "candidate similarity found"
        End if
    End for
    Return "no similarity"
```

If the previous step does not return a similarity $D_0$, the process of the example ends outputting that the candidate solid and the test solid are not similar. Otherwise, the "candidate similarity confirmation" CSC step is run as follows. Number k accumulates the total area of candidate solids' faces similar to faces of the test solid according to similarity $D_0$.

```
CSC(D₀, k)
    k := 0
    For i := 1 to n do begin
        For j := 1 to m do begin
            If D₀(s(fᵢ)) = s(gⱼ) then k := k + Area(gⱼ)
        End for
    End for
```

Let A be the area of the candidate solid's boundary. If the ratio $$\frac{k}{A}$$

is larger than the user defined similarity criterion $c \in ]0,1]$, the process ends outputting that the candidate solid is similar to the test solid. Otherwise, the "candidate similarity searching" program is run again with $p_0$ as input parameter. This forces the searching to start from the previous candidate similarity detection. The overall process is captured in FIG. 26.

An option mentioned earlier is now discussed: a pre-ordering of the shape descriptors.

Experiments show that computing time is much smaller when the shape descriptors are ordered according to the decreasing numbers of faces' vertices. This way, shape descriptors of faces featuring the largest number of vertices are compared first. If a similarity transformation exists, it is more rapidly found by comparing complex faces.

This phenomenon is illustrated in FIGS. 27-28. Front face 1 of the solid of FIG. 27 is similar to front face 2 and back face 3 of the solid of FIG. 28. Front face 4 of the solid of FIG. 27 solid is similar to front face 5 and back face 6 of the solid of FIG. 28. Conversely, face 7 of the solid of FIG. 27 is only similar to face 8 of the solid of FIG. 28. Faces 7 and 8 are the most complex faces of respective solids since they feature 8 vertices instead of 4. Starting the searching with faces 7 and 8 yields the correct similarity transformation at first shot.

Also worth discussing is the fact mentioned earlier that the method may be used for partial searching with no loss of generality. Partial searching is to identify a feature on the test solid and to search for candidate solids including the said feature. The feature is a set of relevant faces selected by the user.

Also worth discussing is the fact that the method may be used in the case of a close (oriented) skin but also in an the case of open skins. Similarity computation is based on axis systems comparison. The robustness of the method is based on the uniqueness of these axis systems, which are defined by the solid's geometry and topology. The uniqueness comes from the fact that, since the B-Rep of the solid is a closed skin, a unique topological orientation can be defined. The convention is that the normal vector points toward the outside of the solid. When dealing with open skins, the topological orientation is not unique because there exist no "inside" or "outside" volume. Indeed, an open skin features one topological orientation arbitrarily chosen among two possible orientations, as illustrated in FIGS. 29-30. Switching from one orientation to the other changes a (P, U, V, N)

axis system into (P, V, U, −N). For this reason, if the similarity diagnostic is negative with the original orientation of the test skin, another computation must be performed with its reverse orientation.

Also worth discussing is the earlier-mentioned fact that the method may be extended to other data formats than B-Reps. Axis systems used for similarity computation are built on the B-Rep of the solid. In fact any solid modeling representation enabling axis systems computation can be used for similarity, even if it is not the full B-Rep. Tests performed on triangulated data format coded with single precision floating-point numbers (as opposed to double precision floating-point numbers) also showed that using principal inertia axis systems provides more accurate similarity recognition.

As mentioned earlier, tests performed have shown that the method can accurately find similar mechanical parts in a mechanical design context. A test case involved two solids as illustrated in FIG. 31. Solid A is an L-shape prism on top of a cylinder. Solid B is an L-shape prism on top of a parallelepiped. L-shape prisms are proportional, meaning that dimensions of solid A L-shape prism are half the dimensions of solid B L-shape prism. The method is able to recognize that L-shape prism of solid A is similar to L-shape prism of solid B. The similarity transformation is here the combination of a reflection and a uniform scaling.

While this invention has been particularly shown and described with references to example embodiments thereof, it will be understood by those skilled in the art that various changes in form and details may be made therein without departing from the scope of the invention encompassed by the appended claims.

The invention claimed is:

1. A computer-implemented method for querying a database that comprises 3D modeled objects that represent mechanical parts, the method comprising:
   by a processor coupled to computer memory:
   providing a query that includes a likeness criterion relative to a value of a predetermined shape descriptor for an input 3D modeled object;
   returning, as results of the query, respective 3D modeled objects of the database, a respective 3D modeled object being returned based on an extent to which a value of a predetermined shape descriptor for the respective 3D modeled object meets the likeness criterion;
   wherein:
   the 3D modeled objects of the database and the input 3D modeled object are each defined at least by a 3D mesh, the 3D mesh of a 3D modeled object having vertices and edges connecting the vertices, the vertices and the edges forming faces that represent an envelop of a mechanical part represented by the 3D modeled object,
   the value of the predetermined shape descriptor for the respective 3D modeled object includes a set of axis systems that are trihedral, the set of axis systems being in a bijective association with a set of pairs consisting of a respective vertex of the 3D mesh of the respective 3D modeled object and a respective face of the 3D mesh of the respective 3D modeled object,
   an axis of a respective axis system being oriented based on directions, at the respective vertex, of edges connected to the respective vertex, on a direction, at the respective vertex, normal to the envelop of the mechanical part represented by the 3D modeled object, and on an orientation of a face that corresponds to an outside of the mechanical part,
   a likeness of a first value of a predetermined shape descriptor for a first 3D modeled object relative to a second value of a predetermined shape descriptor for a second 3D modeled object increasingly depends on an extent to which a set of axis systems of the second value of the predetermined shape descriptor matches a set of axis systems of the first value of the predetermined shape descriptor modulo a same similarity transformation.

2. The method of claim 1, wherein the extent to which the set of axis systems of the second value of the predetermined shape descriptor matches the set of axis systems of the first value of the predetermined shape descriptor is evaluated in a predetermined way for a given similarity transformation type.

3. The method of claim 2, wherein a respective axis system of the second value of the predetermined shape descriptor matching a respective axis system of the first value of the predetermined shape descriptor modulo the given similarity transformation weights in the extent to which the set of axis systems of the second value of the predetermined shape descriptor matches the set of axis systems of the first value of the predetermined shape descriptor, only if a face that is associated to the respective axis system of the second value of the predetermined shape descriptor matches a face that is associated to the respective axis system of the first value of the predetermined shape descriptor modulo the given similarity transformation.

4. The method of claim 3, wherein the extent to which the set of axis systems of the second value of the predetermined shape descriptor matches the set of axis systems of the first value of the predetermined shape descriptor is evaluated for a given similarity transformation as a ratio of faces associated to axis systems of the second value of the predetermined shape descriptor that match faces associated to axis systems of the first value of the predetermined shape descriptor modulo the given similarity transformation.

5. The method of claim 1, wherein:
   the 3D modeled objects of the database and the input 3D modeled object are each further defined by supporting surfaces and data that define the faces formed by the vertices and the edges of the 3D meshes as a bounded portion of a respected supporting surface, the 3D modeled objects being thereby defined by a boundary representation,
   the value of the predetermined shape descriptor for the respective 3D modeled object further includes for each respective face of the respective 3D modeled object a sampling of the bounded portion of the supporting surface defined by the respective face,
   the likeness of the first value of the predetermined shape descriptor relative to the second value of the predetermined shape descriptor further increasingly depends on an extent to which samplings of the second value of the predetermined shape descriptor match samplings of the first value of the predetermined shape descriptor modulo the same similarity transformation.

6. The method of claim 5, wherein the likeness of the first value of the predetermined shape descriptor relative to the second value of the predetermined shape descriptor is evaluated according to an iteration of a scheme that includes, at each iteration, finding a new candidate similarity transformation and then evaluating the likeness along the candidate similarity transformation, a new candidate similarity transformation being found at each iteration based solely on axis system information.

7. The method of claim 1, wherein at least one of: the 3D modeled objects of the database and the input 3D modeled object are user-defined according to a mechanical design process.

8. A data storage and retrieval system for 3D modeled objects, the system comprising:
a non-transitory computer readable storage medium having a database recorded thereon; and
a processor coupled to the computer readable storage medium, the processor programmed to configure the database with 3D modeled objects that represent mechanical parts and that are each defined at least by a 3D mesh, wherein:
the 3D mesh of a 3D modeled object having vertices and edges connecting the vertices, the vertices and the edges forming faces that represent an envelop of a mechanical part represented by the 3D modeled object,
each respective 3D modeled object of the database being associated to a value of a predetermined shape descriptor for the respective 3D modeled object, the value of the predetermined shape descriptor for the respective 3D modeled object including a set of axis systems that are trihedral, the set of axis systems being in a bijective association with a set of pairs consisting of a respective vertex of the 3D mesh of the respective 3D modeled object and a respective face of the 3D mesh of the respective 3D modeled object,
an axis of a respective axis system being oriented based on directions, at the respective vertex, of edges connected to the respective vertex, on a direction, at the respective vertex, normal to the envelop of the mechanical part represented by the 3D modeled object, and on an orientation of a face that corresponds to an outside of the mechanical part,
the database being configured so that a query on the database that includes a likeness criterion relative to a value of a predetermined shape descriptor for an input 3D modeled object returns, as results of the query, respective 3D modeled objects of the database, based on an extent to which a value of a predetermined shape descriptor for the respective 3D modeled object respects the likeness criterion, a likeness of a first value of a predetermined shape descriptor for a first 3D modeled object relative to a second value of a predetermined shape descriptor for a second 3D modeled object increasingly depending on an extent to which a set of axis systems of the second value of the predetermined shape descriptor matches a set of axis systems of the first value of the predetermined shape descriptor modulo a same similarity transformation.

9. The data storage and retrieval system of claim 8, wherein:
the 3D modeled objects of the database are each further defined by supporting surfaces and data that define the faces formed by the vertices and the edges of the 3D meshes as a bounded portion of a respected supporting surface, the 3D modeled objects being thereby defined by a boundary representation,
the value of the predetermined shape descriptor for the respective 3D modeled object further includes for each respective face of the respective 3D modeled object a sampling of the bounded portion of the supporting surface defined by the respective face.

10. The data storage and retrieval system of claim 8, wherein the 3D modeled objects of the database are user-defined according to a mechanical design process.

11. A computer-implemented method for constructing a database, the method comprising:
adding to the database 3D modeled objects that represent mechanical parts and that are each defined at least by a 3D mesh, wherein:
the 3D mesh of a 3D modeled object having vertices and edges connecting the vertices, the vertices and the edges forming faces that represent an envelop of a mechanical part represented by the 3D modeled object,
each respective 3D modeled object of the database being associated to a value of a predetermined shape descriptor for the respective 3D modeled object,
the value of the predetermined shape descriptor for the respective 3D modeled object including a set of axis systems that are trihedral, the set of axis systems being in a bijective association with a set of pairs consisting of a respective vertex of the 3D mesh of the respective 3D modeled object and a respective face of the 3D mesh of the respective 3D modeled object,
an axis of a respective axis system being oriented based on directions, at the respective vertex, of edges connected to the respective vertex, on a direction, at the respective vertex, normal to the envelop of the mechanical part represented by the 3D modeled object, and on an orientation of a face that corresponds to an outside of the mechanical part,
the database being configured so that a query on the database that includes a likeness criterion relative to a value of a predetermined shape descriptor for an input 3D modeled object returns, as results of the query, respective 3D modeled objects of the database, based on an extent to which a value of a predetermined shape descriptor for the respective 3D modeled object respects the likeness criterion, a likeness of a first value of a predetermined shape descriptor for a first 3D modeled object relative to a second value of a predetermined shape descriptor for a second 3D modeled object increasingly depending on an extent to which a set of axis systems of the second value of the predetermined shape descriptor matches a set of axis systems of the first value of the predetermined shape descriptor modulo a same similarity transformation.

12. A computer program product comprising:
a non-transitory computer readable storage medium having code instructions stored thereon, the storage medium operatively coupled to a processor, such that when executed by the processor for querying a database that comprises 3D modeled objects that represent mechanical parts, the code instructions cause the processor to:
provide a query that includes a likeness criterion relative to a value of a predetermined shape descriptor for an input 3D modeled object;
return, as results of the query, respective 3D modeled objects of the database, a respective 3D modeled object being returned based on an extent to which a value of a predetermined shape descriptor for the respective 3D modeled object respects the likeness criterion;
wherein:
the 3D modeled objects of the database and the input 3D modeled object are each defined at least by a 3D mesh, the 3D mesh of a 3D modeled object having vertices and edges connecting the vertices, the vertices and the edges forming faces that represent an envelop of a mechanical part represented by the 3D modeled object,
the value of the predetermined shape descriptor for the respective 3D modeled object includes a set of axis systems that are trihedral, the set of axis systems being in a bijective association with a set of pairs consisting of a respective vertex of the 3D mesh of the respective 3D modeled object and a respective face of the 3D mesh of the respective 3D modeled object, an axis of a respective axis system being oriented based on directions, at the respective vertex, of edges connected to the respective vertex, on a direction, at the respective vertex, normal to the envelop of the mechanical part represented by the 3D modeled object, and on an orientation of a face that corresponds to an outside of the mechanical part, a likeness of a first value of a predetermined shape descriptor for a first 3D modeled object relative to a second value of a predetermined shape descriptor for a second 3D modeled object increasingly depends on an extent to which a set of axis systems of the second value of the predetermined shape descriptor matches a set of axis systems of the first value of the predetermined shape descriptor modulo a same similarity transformation.

13. A computer system for querying a database that comprises 3D modeled objects that represent mechanical parts, the system comprising:

a processor; and memory operatively coupled to the processor, the memory having recorded thereon code instructions, such that when executed by the processor, the computer code instructions cause the system to:

provide a query that includes a likeness criterion relative to a value of a predetermined shape descriptor for an input 3D modeled object;

return, as results of the query, respective 3D modeled objects of the database, a respective 3D modeled object being returned based on an extent to which a value of a predetermined shape descriptor for the respective 3D modeled object respects the likeness criterion;

wherein:

the 3D modeled objects of the database and the input 3D modeled object are each defined at least by a 3D mesh, the 3D mesh of a 3D modeled object having vertices and edges connecting the vertices, the vertices and the edges forming faces that represent an envelop of a mechanical part represented by the 3D modeled object, the value of the predetermined shape descriptor for a respective 3D modeled object includes a set of axis systems that are trihedral, the set of axis systems being in a bijective association with a set of pairs consisting of a respective vertex of the 3D mesh of the respective 3D modeled object and a respective face of the 3D mesh of the respective 3D modeled object, an axis of a respective axis system being oriented based on directions, at the respective vertex, of edges connected to the respective vertex, on a direction, at the respective vertex, normal to the envelop of the mechanical part represented by the 3D modeled object, and on an orientation of a face that corresponds to an outside of the mechanical part, a likeness of a first value of a predetermined shape descriptor for a first 3D modeled object relative to a second value of a predetermined shape descriptor for a second 3D modeled object increasingly depends on an extent to which a set of axis systems of the second value of the predetermined shape descriptor matches a set of axis systems of the first value of the predetermined shape descriptor modulo a same similarity transformation.

14. A computer program product comprising:

a non-transitory computer-readable storage medium having code instructions stored thereon, the storage medium operatively coupled to a processor, such that when executed by the processor for constructing a database, the code instructions cause the processor to:

add to the database 3D modeled objects that represent mechanical parts and that are each defined at least by a 3D mesh, wherein:

the 3D mesh of a 3D modeled object having vertices and edges connecting the vertices, the vertices and the edges forming faces that represent an envelop of a mechanical part represented by the 3D modeled object, each respective 3D modeled object of the database being associated to a value of a predetermined shape descriptor for the respective 3D modeled object, the value of the predetermined shape descriptor for the respective 3D modeled object including a set of axis systems that are trihedral, the set of axis systems being in a bijective association with a set of pairs consisting of a respective vertex of the 3D mesh of the respective 3D modeled object and a respective face of the 3D mesh of the respective 3D modeled object, an axis of a respective axis system being oriented based on directions, at the respective vertex, of edges connected to the respective vertex, on a direction, at the respective vertex, normal to the envelop of the mechanical part represented by the 3D modeled object, and on an orientation of a face that corresponds to an outside of the mechanical part, the database being configured so that a query on the database that includes a likeness criterion relative to a value of a predetermined shape descriptor for an input 3D modeled object returns, as results of the query, respective 3D modeled objects of the database, based on an extent to which a value of a predetermined shape descriptor for the respective 3D modeled object respects the likeness criterion, a likeness of a first value of a predetermined shape descriptor for a first 3D modeled object relative to a second value of a predetermined shape descriptor for a second 3D modeled object increasingly depending on an extent to which a set of axis systems of the second value of the predetermined shape descriptor matches a set of axis systems of the first value of the predetermined shape descriptor modulo a same similarity transformation.

* * * * *